US011791442B2

(12) United States Patent
Keller et al.

(10) Patent No.: US 11,791,442 B2
(45) Date of Patent: Oct. 17, 2023

(54) LIGHT EMITTING DIODE PACKAGE AND METHOD FOR FABRICATING SAME

(71) Applicant: CreeLED, Inc., Durham, NC (US)

(72) Inventors: Bernd Keller, Santa Barbara, CA (US); Nicholas Medendorp, Jr., Raleigh, NC (US); Thomas Yuan, Ventura, CA (US)

(73) Assignee: CreeLED, Inc., Durham, NC (US)

( * ) Notice: Subject to any disclaimer, the term of this patent is extended or adjusted under 35 U.S.C. 154(b) by 0 days.

(21) Appl. No.: 17/127,154

(22) Filed: Dec. 18, 2020

(65) Prior Publication Data

US 2021/0143302 A1     May 13, 2021

Related U.S. Application Data

(60) Continuation of application No. 14/705,228, filed on May 6, 2015, now Pat. No. 10,892,383, which is a
(Continued)

(51) Int. Cl.
*H01L 33/48*     (2010.01)
*H01L 33/64*     (2010.01)
(Continued)

(52) U.S. Cl.
CPC ............ *H01L 33/486* (2013.01); *H01L 33/58* (2013.01); *H01L 33/62* (2013.01); *H01L 33/64* (2013.01);
(Continued)

(58) Field of Classification Search
CPC ....... H01L 33/486; H01L 33/58; H01L 33/62; H01L 33/64; H01L 33/54; H01L 33/647;
(Continued)

(56) References Cited

U.S. PATENT DOCUMENTS 2,002,111 A    5/1935   Hansen
3,674,990 A    7/1972   Kurauchi et al.
(Continued)

FOREIGN PATENT DOCUMENTS

CN     1406450 A     3/2003
CN     2549312 Y     5/2003
(Continued)

OTHER PUBLICATIONS

Office Action for Japanese Patent Application No. 2008-81533, dated Jul. 22, 2014.
(Continued)

*Primary Examiner* — Cuong B Nguyen
(74) *Attorney, Agent, or Firm* — Withrow & Terranova, P.L.L.C.

(57) ABSTRACT

An LED package comprising a submount having a top and bottom surface with a plurality of top electrically and thermally conductive elements on its top surface. An LED is included on one of the top elements such that an electrical signal applied to the top elements causes the LED to emit light. The electrically conductive elements also spread heat from the LED across the majority of the submount top surface. A bottom thermally conductive element is included on the bottom surface of said submount and spreads heat from the submount, and a lens is formed directly over the LED. A method for fabricating LED packages comprising providing a submount panel sized to be separated into a plurality of LED package submounts. Top conductive elements are formed on one surface of the submount panel for a plurality of LED packages, and LEDs are attached to the top elements. Lenses are molded over the LEDs and the substrate panel is singulated to separate it into a plurality of LED packages.

22 Claims, 9 Drawing Sheets

Related U.S. Application Data division of application No. 11/982,275, filed on Oct. 31, 2007, now Pat. No. 9,070,850.

(51) Int. Cl.
  *H01L 33/62* (2010.01)
  *H01L 33/58* (2010.01)
  *H01L 33/54* (2010.01)

(52) U.S. Cl.
  CPC ............ *H01L 33/54* (2013.01); *H01L 33/647* (2013.01); *H01L 2224/32245* (2013.01); *H01L 2224/48091* (2013.01); *H01L 2224/48227* (2013.01); *H01L 2224/48247* (2013.01); *H01L 2224/73265* (2013.01); *H01L 2924/01019* (2013.01); *H01L 2924/01087* (2013.01); *H01L 2933/0025* (2013.01); *H01L 2933/0033* (2013.01); *H01L 2933/0058* (2013.01)

(58) Field of Classification Search
  CPC . H01L 2224/32245; H01L 2224/48091; H01L 2224/48227; H01L 2224/48247; H01L 2224/73265; H01L 2924/01019; H01L 2924/01087; H01L 2933/0025; H01L 2933/0033; H01L 2933/0058; H01L 33/48–648; H01L 2933/005; H01L 2933/0066–0091; H01L 25/18
  See application file for complete search history.

(56) References Cited

U.S. PATENT DOCUMENTS

| | | | |
|---|---|---|---|
| 3,760,237 A | 9/1973 | Jaffe | |
| 3,900,863 A | 8/1975 | Kim | |
| 4,152,044 A | 5/1979 | Liu | |
| 4,307,297 A | 12/1981 | Groff et al. | |
| 4,322,735 A | 3/1982 | Sadamasa et al. | |
| 4,500,914 A | 2/1985 | Watanabe et al. | |
| 4,511,425 A | 4/1985 | Boyd et al. | |
| 4,675,575 A | 6/1987 | Smith et al. | |
| 4,946,547 A | 8/1990 | Palmour et al. | |
| 4,972,089 A | 11/1990 | Stevenson | |
| 4,992,704 A | 2/1991 | Stinson | |
| 5,040,868 A | 8/1991 | Waitl et al. | |
| 5,042,048 A | 8/1991 | Meyer | |
| 5,122,943 A | 6/1992 | Pugh | |
| 5,130,761 A | 7/1992 | Tanaka | |
| 5,167,556 A | 12/1992 | Stein | |
| 5,184,114 A | 2/1993 | Brown | |
| 5,200,022 A | 4/1993 | Kong et al. | |
| 5,278,432 A | 1/1994 | Ignatius et al. | |
| 5,351,106 A | 9/1994 | Lesko et al. | |
| RE34,861 E | 2/1995 | Davis et al. | |
| 5,400,221 A | 3/1995 | Kawaguchi | |
| 5,453,405 A | 9/1995 | Fan et al. | |
| 5,454,437 A | 10/1995 | Estes | |
| 5,477,436 A | 12/1995 | Bertling et al. | |
| 5,643,834 A | 7/1997 | Harada et al. | |
| 5,703,401 A | 12/1997 | van de Water et al. | |
| 5,706,177 A | 1/1998 | Nather et al. | |
| 5,790,298 A | 8/1998 | Tonar | |
| 5,813,753 A | 9/1998 | Vriens et al. | |
| 5,907,151 A | 5/1999 | Gramann et al. | |
| 5,942,770 A | 8/1999 | Ishinaga et al. | |
| 5,946,022 A | 8/1999 | Kamimura | |
| 5,959,316 A | 9/1999 | Lowery | |
| 5,990,497 A | 11/1999 | Kamakura et al. | |
| 6,061,160 A | 5/2000 | Maruyama | |
| 6,066,861 A | 5/2000 | Hohn et al. | |
| 6,093,940 A | 7/2000 | Ishinaga et al. | |
| 6,183,100 B1 | 2/2001 | Suckow et al. | |
| 6,224,216 B1 | 5/2001 | Parker et al. | |
| 6,259,608 B1 | 7/2001 | Berardinelli et al. | |
| 6,274,924 B1 | 8/2001 | Carey et al. | |
| 6,296,367 B1 | 10/2001 | Parsons et al. | |
| 6,297,598 B1 | 10/2001 | Wang et al. | |
| 6,330,111 B1 | 12/2001 | Myers | |
| 6,331,915 B1 | 12/2001 | Myers | |
| 6,345,903 B1 | 2/2002 | Koike et al. | |
| 6,359,236 B1 | 3/2002 | DiStefano et al. | |
| 6,376,902 B1 | 4/2002 | Arndt | |
| 6,392,294 B1 | 5/2002 | Yamaguchi | |
| 6,399,358 B1 | 6/2002 | Williams et al. | |
| 6,447,124 B1 | 9/2002 | Fletcher et al. | |
| 6,469,321 B2 | 10/2002 | Arndt | |
| 6,476,410 B2 | 11/2002 | Ishinaga | |
| 6,480,389 B1 | 11/2002 | Shie et al. | |
| 6,501,084 B1 | 12/2002 | Sakai et al. | |
| 6,517,218 B2 | 2/2003 | Hochstein | |
| 6,536,913 B1 | 3/2003 | Yajima et al. | |
| 6,573,537 B1 | 6/2003 | Steigerwald et al. | |
| 6,573,580 B2 | 6/2003 | Arndt | |
| 6,577,073 B2 | 6/2003 | Shimizu et al. | |
| 6,590,152 B1 | 7/2003 | Horio et al. | |
| 6,610,563 B1 | 8/2003 | Waitl et al. | |
| 6,610,863 B2 | 8/2003 | Arumugam et al. | |
| 6,614,058 B2 | 9/2003 | Lin et al. | |
| 6,617,795 B2 | 9/2003 | Bruning | |
| 6,621,210 B2 | 9/2003 | Kato et al. | |
| 6,624,491 B2 | 9/2003 | Waitl et al. | |
| 6,657,393 B2 | 12/2003 | Natsume | |
| 6,661,029 B1 | 12/2003 | Duggal | |
| 6,680,490 B2 | 1/2004 | Yasukawa et al. | |
| 6,686,609 B1 | 2/2004 | Sung | |
| 6,696,609 B2 | 2/2004 | Tokuda et al. | |
| 6,700,136 B2 | 3/2004 | Guida | |
| 6,707,069 B2 | 3/2004 | Song et al. | |
| 6,710,373 B2 | 3/2004 | Wang | |
| 6,717,353 B1 | 4/2004 | Mueller et al. | |
| 6,739,735 B2 | 5/2004 | Talamo et al. | |
| 6,746,889 B1 | 6/2004 | Eliashevich et al. | |
| 6,759,733 B2 | 7/2004 | Arndt | |
| 6,765,235 B2 | 7/2004 | Taninaka et al. | |
| 6,770,498 B2 | 8/2004 | Hsu | |
| 6,774,401 B2 | 8/2004 | Nakada et al. | |
| 6,784,463 B2 | 8/2004 | Camras et al. | |
| 6,791,259 B1 | 9/2004 | Stokes et al. | |
| 6,858,879 B2 | 2/2005 | Waitl et al. | |
| 6,872,585 B2 | 3/2005 | Matsumura et al. | |
| 6,876,149 B2 | 4/2005 | Miyashita | |
| 6,900,511 B2 | 5/2005 | Ruhnau et al. | |
| 6,909,123 B2 | 6/2005 | Hayashimoto et al. | |
| 6,911,678 B2 | 6/2005 | Fujisawa et al. | |
| 6,914,268 B2 | 7/2005 | Shei et al. | |
| 6,919,586 B2 | 7/2005 | Fujii | |
| 6,932,497 B1 | 8/2005 | Huang | |
| 6,940,704 B2 | 9/2005 | Stalions | |
| 6,946,714 B2 | 9/2005 | Waitl et al. | |
| 6,948,825 B2 | 9/2005 | Christoph | |
| 6,949,772 B2 | 9/2005 | Shimizu et al. | |
| 6,964,877 B2 | 11/2005 | Chen et al. | |
| 6,975,011 B2 | 12/2005 | Arndt et al. | |
| 6,995,510 B2 | 2/2006 | Murakami et al. | |
| 7,002,546 B1 | 2/2006 | Stuppi et al. | |
| D517,025 S | 3/2006 | Asakawa | |
| 7,009,627 B2 | 3/2006 | Abe et al. | |
| 7,015,512 B2 | 3/2006 | Park et al. | |
| 7,021,797 B2 | 4/2006 | Minano et al. | |
| 7,064,907 B2 | 6/2006 | Kaneko | |
| 7,066,626 B2 | 6/2006 | Omata | |
| 7,087,936 B2 | 8/2006 | Negley | |
| 7,095,053 B2 | 8/2006 | Mazzochette et al. | |
| 7,098,483 B2 | 8/2006 | Mazzochette et al. | |
| 7,102,213 B2 | 9/2006 | Sorg | |
| 7,119,422 B2 | 10/2006 | Chin | |
| 7,161,189 B2 | 1/2007 | Wu | |
| 7,176,503 B2 | 2/2007 | Kim et al. | |
| 7,187,009 B2 | 3/2007 | Fukasawa et al. | |
| 7,204,607 B2 | 4/2007 | Vano et al. | |
| 7,213,940 B1 | 5/2007 | Van De Ven et al. | |
| 7,224,000 B2 | 5/2007 | Aanegola et al. | |
| 7,244,965 B2 | 7/2007 | Andrews et al. | |
| 7,252,408 B2 | 8/2007 | Mazzochette et al. | |

(56) References Cited

U.S. PATENT DOCUMENTS

| | | |
|---|---|---|
| 7,259,400 B1 | 8/2007 | Taskar |
| 7,262,437 B2 | 8/2007 | Bogner et al. |
| 7,282,740 B2 | 10/2007 | Chikugawa et al. |
| 7,285,802 B2 | 10/2007 | Ouderkirk et al. |
| 7,286,926 B2 | 10/2007 | Gotoh et al. |
| 7,303,315 B2 | 12/2007 | Ouderkirk et al. |
| 7,355,562 B2 | 4/2008 | Schubert et al. |
| 7,381,995 B2 | 6/2008 | Tain et al. |
| 7,387,421 B2 | 6/2008 | Lee et al. |
| D572,210 S | 7/2008 | Lee |
| D572,670 S | 7/2008 | Ono et al. |
| D576,574 S | 9/2008 | Kobayakawa |
| 7,429,757 B2 | 9/2008 | Oyama et al. |
| 7,439,549 B2 | 10/2008 | Marchl et al. |
| 7,478,922 B2 | 1/2009 | Garbus, Jr. |
| 7,528,421 B2 | 5/2009 | Mazzochette |
| 7,579,628 B2 | 8/2009 | Inoguchi |
| 7,605,452 B2 | 10/2009 | Yamanaka et al. |
| 7,614,759 B2 | 11/2009 | Negley |
| 7,621,655 B2 | 11/2009 | Roberts et al. |
| 7,622,795 B2 | 11/2009 | Chiang |
| 7,635,915 B2 | 12/2009 | Xie et al. |
| 7,638,811 B2 | 12/2009 | Slater, Jr. |
| 7,646,035 B2 | 1/2010 | Loh et al. |
| 7,665,861 B2 | 2/2010 | Blumel et al. |
| 7,692,206 B2 | 4/2010 | Loh |
| 7,700,964 B2 | 4/2010 | Morimoto et al. |
| 7,718,991 B2 | 5/2010 | Negley |
| 7,722,220 B2 | 5/2010 | Van De Ven |
| 7,723,744 B2 | 5/2010 | Gillies et al. |
| 7,772,609 B2 | 8/2010 | Yan |
| 7,777,412 B2 | 8/2010 | Pang |
| 7,821,023 B2 | 10/2010 | Yuan et al. |
| 7,828,460 B2 | 11/2010 | Van De Ven et al. |
| 7,829,899 B2 | 11/2010 | Hutchins |
| 7,862,214 B2 | 1/2011 | Trott et al. |
| 7,875,899 B2 | 1/2011 | Yasuda |
| 7,897,980 B2 | 3/2011 | Yuan et al. |
| 7,902,560 B2 | 3/2011 | Bierhuizen et al. |
| 7,923,831 B2 | 4/2011 | Ng |
| 7,932,111 B2 | 4/2011 | Edmond |
| 7,939,848 B2 | 5/2011 | Kim et al. |
| 7,959,329 B2 | 6/2011 | Van De Ven |
| 3,008,676 A1 | 8/2011 | Negley et al. |
| 7,993,036 B2 | 8/2011 | Holder et al. |
| 7,999,283 B2 | 8/2011 | Chakraborty et al. |
| 3,011,818 A1 | 9/2011 | Negley |
| 8,022,626 B2 | 9/2011 | Hamby et al. |
| 8,033,692 B2 | 10/2011 | Negley et al. |
| 8,035,603 B2 | 10/2011 | Furukawa et al. |
| 8,040,317 B2 | 10/2011 | Teshirogi |
| 8,071,443 B2 | 12/2011 | Ahn et al. |
| 8,096,670 B2 | 1/2012 | Trott et al. |
| 8,098,364 B2 | 1/2012 | Yu et al. |
| 8,123,384 B2 | 2/2012 | Negley et al. |
| 8,177,382 B2 | 5/2012 | Roberts et al. |
| 8,217,414 B2 | 7/2012 | Hayashi |
| 8,264,138 B2 | 9/2012 | Negley et al. |
| 8,272,757 B1 | 9/2012 | Fan et al. |
| 8,337,071 B2 | 12/2012 | Negley et al. |
| 8,511,855 B2 | 8/2013 | Marchl et al. |
| 8,563,339 B2 | 10/2013 | Tarsa et al. |
| 8,596,819 B2 | 12/2013 | Negley et al. |
| 8,638,377 B2 | 1/2014 | Shoyama |
| 8,827,507 B2 | 9/2014 | Van De Ven et al. |
| 8,878,219 B2 | 11/2014 | Chitnis et al. |
| 8,957,430 B2 | 2/2015 | Donofrio |
| 8,994,045 B2 | 3/2015 | Negley |
| 9,024,349 B2 | 5/2015 | Chitnis et al. |
| 9,057,511 B2 | 6/2015 | Le et al. |
| 9,062,830 B2 | 6/2015 | Le et al. |
| 9,070,850 B2 | 6/2015 | Keller et al. |
| 9,159,888 B2 | 10/2015 | Chitnis et al. |
| 9,310,026 B2 | 4/2016 | Negley |
| 9,318,674 B2 | 4/2016 | Hussell et al. |
| 9,431,589 B2 | 8/2016 | Loh et al. |
| 9,605,828 B2 | 3/2017 | Pickard et al. |
| 9,777,897 B2 | 10/2017 | Pickard et al. |
| 2001/0032985 A1 | 10/2001 | Bhat et al. |
| 2001/0033726 A1 | 10/2001 | Shie et al. |
| 2002/0001193 A1 | 1/2002 | Osawa et al. |
| 2002/0015013 A1 | 2/2002 | Ragle |
| 2002/0029071 A1 | 3/2002 | Whitehurst |
| 2002/0030194 A1 | 3/2002 | Camras et al. |
| 2002/0054495 A1 | 5/2002 | Natsume |
| 2002/0061174 A1 | 5/2002 | Hurt et al. |
| 2002/0066905 A1 | 6/2002 | Wang et al. |
| 2002/0070681 A1 | 6/2002 | Shimizu et al. |
| 2002/0093820 A1 | 7/2002 | Pederson |
| 2002/0097579 A1 | 7/2002 | Stalions |
| 2002/0113246 A1 | 8/2002 | Nagai et al. |
| 2002/0123163 A1 | 9/2002 | Fujii |
| 2002/0123164 A1 | 9/2002 | Slater, Jr. et al. |
| 2002/0156187 A1 | 10/2002 | Greene |
| 2002/0163001 A1 | 11/2002 | Shaddock |
| 2002/0171087 A1 | 11/2002 | Krames et al. |
| 2002/0171911 A1 | 11/2002 | Maegawa |
| 2002/0195935 A1 | 12/2002 | Jager et al. |
| 2003/0015708 A1 | 1/2003 | Parikh et al. |
| 2003/0053310 A1 | 3/2003 | Sommers |
| 2003/0058641 A1 | 3/2003 | Watanabe et al. |
| 2003/0072153 A1 | 4/2003 | Matsui et al. |
| 2003/0116769 A1 | 6/2003 | Song et al. |
| 2003/0121511 A1 | 7/2003 | Hashimura et al. |
| 2003/0142712 A1 | 7/2003 | Ikeda et al. |
| 2003/0147055 A1 | 8/2003 | Yokoyama |
| 2003/0160256 A1 | 8/2003 | Durocher et al. |
| 2003/0171150 A1 | 9/2003 | Oki et al. |
| 2003/0183852 A1 | 10/2003 | Takenaka |
| 2003/0189829 A1 | 10/2003 | Shimizu et al. |
| 2004/0016938 A1 | 1/2004 | Baretz et al. |
| 2004/0026706 A1 | 2/2004 | Bogner et al. |
| 2004/0036081 A1 | 2/2004 | Okazaki |
| 2004/0037076 A1 | 2/2004 | Katoh et al. |
| 2004/0041222 A1 | 3/2004 | Loh |
| 2004/0047151 A1 | 3/2004 | Bogner et al. |
| 2004/0061120 A1 | 4/2004 | Mizuyoshi |
| 2004/0079957 A1 | 4/2004 | Andrews et al. |
| 2004/0080251 A1 | 4/2004 | Steranka et al. |
| 2004/0080939 A1 | 4/2004 | Braddell et al. |
| 2004/0089939 A1 | 5/2004 | Ogihara et al. |
| 2004/0090174 A1 | 5/2004 | Tasch et al. |
| 2004/0099874 A1 | 5/2004 | Chang et al. |
| 2004/0104391 A1 | 6/2004 | Maeda et al. |
| 2004/0126913 A1 | 7/2004 | Loh |
| 2004/0135522 A1 | 7/2004 | Berman et al. |
| 2004/0141241 A1 | 7/2004 | Claytor |
| 2004/0170018 A1* | 9/2004 | Nawashiro ............... F21V 5/04 362/244 |
| 2004/0184272 A1 | 9/2004 | Wright et al. |
| 2004/0188696 A1 | 9/2004 | Hsing Chen et al. |
| 2004/0207313 A1 | 10/2004 | Omoto et al. |
| 2004/0207999 A1 | 10/2004 | Suehiro et al. |
| 2004/0217364 A1 | 11/2004 | Tarsa et al. |
| 2004/0222433 A1 | 11/2004 | Mazzochette et al. |
| 2004/0227149 A1 | 11/2004 | Ibbetson et al. |
| 2004/0232435 A1 | 11/2004 | Hofer et al. |
| 2004/0238930 A1 | 12/2004 | Arndt |
| 2004/0239242 A1 | 12/2004 | Mano et al. |
| 2004/0245532 A1 | 12/2004 | Maeda et al. |
| 2004/0245591 A1 | 12/2004 | Wang et al. |
| 2004/0256626 A1 | 12/2004 | Wang et al. |
| 2004/0256706 A1 | 12/2004 | Nakashima |
| 2005/0023548 A1 | 2/2005 | Bhat et al. |
| 2005/0024868 A1 | 2/2005 | Nagai et al. |
| 2005/0057917 A1 | 3/2005 | Yatsuda et al. |
| 2005/0057929 A1 | 3/2005 | Yano et al. |
| 2005/0072981 A1 | 4/2005 | Suenaga |
| 2005/0073840 A1 | 4/2005 | Chou et al. |
| 2005/0077535 A1 | 4/2005 | Li |
| 2005/0082574 A1 | 4/2005 | Tasch et al. |
| 2005/0082575 A1 | 4/2005 | Chen et al. |
| 2005/0093005 A1 | 5/2005 | Ruhnau et al. |
| 2005/0093422 A1 | 5/2005 | Wang et al. |

(56) References Cited

U.S. PATENT DOCUMENTS

| | | |
|---|---|---|
| 2005/0093430 A1 | 5/2005 | Ibbetson et al. |
| 2005/0110033 A1 | 5/2005 | Heremans et al. |
| 2005/0117320 A1 | 6/2005 | Leu et al. |
| 2005/0122018 A1 | 6/2005 | Morris |
| 2005/0122031 A1 | 6/2005 | Itai et al. |
| 2005/0127377 A1 | 6/2005 | Arndt et al. |
| 2005/0135105 A1 | 6/2005 | Teixeira et al. |
| 2005/0141584 A1 | 6/2005 | Ohe et al. |
| 2005/0152127 A1 | 7/2005 | Kamiya et al. |
| 2005/0156187 A1 | 7/2005 | Isokawa et al. |
| 2005/0173692 A1 | 8/2005 | Park et al. |
| 2005/0179041 A1 | 8/2005 | Harbers et al. |
| 2005/0179376 A1 | 8/2005 | Fung et al. |
| 2005/0199899 A1 | 9/2005 | Lin et al. |
| 2005/0225976 A1 | 10/2005 | Zampini et al. |
| 2005/0231983 A1 | 10/2005 | Dahm |
| 2005/0243545 A1 | 11/2005 | Watanabe |
| 2005/0247944 A1 | 11/2005 | Haque et al. |
| 2005/0253130 A1 | 11/2005 | Tsutsumi et al. |
| 2005/0276053 A1 | 12/2005 | Nortrup et al. |
| 2006/0006404 A1 | 1/2006 | Ibbetson et al. |
| 2006/0006406 A1 | 1/2006 | Kim et al. |
| 2006/0017402 A1 | 1/2006 | McKinney et al. |
| 2006/0022212 A1 | 2/2006 | Waitl et al. |
| 2006/0039143 A1 | 2/2006 | Katoh et al. |
| 2006/0049477 A1 | 3/2006 | Arndt et al. |
| 2006/0049782 A1 | 3/2006 | Vornsand et al. |
| 2006/0054912 A1 | 3/2006 | Murakami et al. |
| 2006/0060867 A1 | 3/2006 | Suehiro |
| 2006/0078246 A1 | 4/2006 | Ashida |
| 2006/0081862 A1 | 4/2006 | Chua et al. |
| 2006/0091406 A1 | 5/2006 | Kaneko et al. |
| 2006/0102914 A1 | 5/2006 | Smits et al. |
| 2006/0102917 A1 | 5/2006 | Oyama et al. |
| 2006/0105478 A1 | 5/2006 | Camras et al. |
| 2006/0105484 A1 | 5/2006 | Basin et al. |
| 2006/0105485 A1* | 5/2006 | Basin .................. H01L 24/97 257/E33.059 |
| 2006/0108594 A1 | 5/2006 | Iwasaki et al. |
| 2006/0128040 A1* | 6/2006 | Chen .................. H01L 24/85 257/E23.179 |
| 2006/0131591 A1 | 6/2006 | Sumitani |
| 2006/0133044 A1 | 6/2006 | Kim et al. |
| 2006/0139580 A1 | 6/2006 | Conner |
| 2006/0151809 A1 | 7/2006 | Isokawa |
| 2006/0157828 A1 | 7/2006 | Sorg |
| 2006/0158899 A1 | 7/2006 | Ayabe et al. |
| 2006/0163589 A1 | 7/2006 | Fan et al. |
| 2006/0180818 A1 | 8/2006 | Nagai et al. |
| 2006/0180925 A1 | 8/2006 | Lee et al. |
| 2006/0220046 A1 | 10/2006 | Yu et al. |
| 2006/0258028 A1 | 11/2006 | Paolini et al. |
| 2006/0261365 A1 | 11/2006 | Hsu |
| 2006/0267031 A1 | 11/2006 | Tasch et al. |
| 2006/0267042 A1 | 11/2006 | Izuno et al. |
| 2006/0278882 A1 | 12/2006 | Leung et al. |
| 2006/0284207 A1 | 12/2006 | Park et al. |
| 2006/0289878 A1 | 12/2006 | Brunner et al. |
| 2006/0291185 A1 | 12/2006 | Atsushi |
| 2007/0013057 A1 | 1/2007 | Mazzochette |
| 2007/0013090 A1 | 1/2007 | Takase et al. |
| 2007/0030676 A1 | 2/2007 | Ichihara |
| 2007/0046176 A1 | 3/2007 | Bukesov et al. |
| 2007/0085944 A1 | 4/2007 | Tanaka et al. |
| 2007/0090383 A1 | 4/2007 | Ota et al. |
| 2007/0096139 A1 | 5/2007 | Schultz |
| 2007/0109779 A1 | 5/2007 | Sekiguchi et al. |
| 2007/0115670 A1* | 5/2007 | Roberts .................. G09F 9/35 362/367 |
| 2007/0139920 A1 | 6/2007 | Van De Ven et al. |
| 2007/0145401 A1 | 6/2007 | Ikehara |
| 2007/0170449 A1 | 7/2007 | Anandan |
| 2007/0170450 A1 | 7/2007 | Murphy |
| 2007/0205711 A1 | 9/2007 | Takashima et al. |
| 2007/0221928 A1 | 9/2007 | Lee et al. |
| 2007/0241357 A1 | 10/2007 | Yan |
| 2007/0247414 A1 | 10/2007 | Roberts |
| 2007/0247855 A1 | 10/2007 | Yano |
| 2007/0252924 A1 | 11/2007 | Haga et al. |
| 2007/0257272 A1 | 11/2007 | Hutchins |
| 2007/0262328 A1 | 11/2007 | Bando |
| 2007/0269586 A1 | 11/2007 | Leatherdale et al. |
| 2007/0278934 A1 | 12/2007 | Van De Ven et al. |
| 2007/0291467 A1 | 12/2007 | Nagai et al. |
| 2007/0294975 A1 | 12/2007 | Nadar et al. |
| 2007/0295972 A1 | 12/2007 | Tsai et al. |
| 2007/0295975 A1 | 12/2007 | Omae |
| 2008/0013319 A1 | 1/2008 | Pei et al. |
| 2008/0022552 A1 | 1/2008 | Forget |
| 2008/0024696 A1 | 1/2008 | Arai et al. |
| 2008/0026498 A1 | 1/2008 | Tarsa et al. |
| 2008/0036364 A1 | 2/2008 | Li et al. |
| 2008/0041625 A1 | 2/2008 | Cheong et al. |
| 2008/0043444 A1 | 2/2008 | Hasegawa et al. |
| 2008/0074029 A1 | 3/2008 | Suehiro |
| 2008/0074032 A1 | 3/2008 | Yano et al. |
| 2008/0079017 A1 | 4/2008 | Loh et al. |
| 2008/0093606 A1 | 4/2008 | Pan et al. |
| 2008/0100774 A1 | 5/2008 | Jeon et al. |
| 2008/0106895 A1 | 5/2008 | Van De Ven et al. |
| 2008/0112164 A1 | 5/2008 | Teshirogi |
| 2008/0121921 A1 | 5/2008 | Loh et al. |
| 2008/0128724 A1 | 6/2008 | Isobe et al. |
| 2008/0128735 A1 | 6/2008 | Yoo et al. |
| 2008/0130285 A1 | 6/2008 | Negley et al. |
| 2008/0137357 A1 | 6/2008 | Friedrichs et al. |
| 2008/0142816 A1 | 6/2008 | Bierhuizen et al. |
| 2008/0149960 A1 | 6/2008 | Amo et al. |
| 2008/0151527 A1 | 6/2008 | Ueno et al. |
| 2008/0170391 A1 | 7/2008 | Norfidathul et al. |
| 2008/0170396 A1 | 7/2008 | Yuan et al. |
| 2008/0174996 A1 | 7/2008 | Lu et al. |
| 2008/0186702 A1 | 8/2008 | Camras et al. |
| 2008/0191232 A1 | 8/2008 | Lee et al. |
| 2008/0191610 A1 | 8/2008 | Oshio |
| 2008/0198594 A1 | 8/2008 | Lee |
| 2008/0203415 A1 | 8/2008 | Thompson et al. |
| 2008/0204366 A1 | 8/2008 | Kane et al. |
| 2008/0225520 A1 | 9/2008 | Garbus |
| 2008/0230790 A1 | 9/2008 | Seko et al. |
| 2008/0232079 A1 | 9/2008 | Awazu |
| 2008/0238335 A1 | 10/2008 | Lee et al. |
| 2008/0239722 A1 | 10/2008 | Wilcox |
| 2008/0258156 A1 | 10/2008 | Hata |
| 2008/0258168 A1 | 10/2008 | Loh et al. |
| 2008/0278655 A1 | 11/2008 | Moon et al. |
| 2008/0285268 A1 | 11/2008 | Oku et al. |
| 2008/0296590 A1 | 12/2008 | Ng |
| 2008/0303052 A1 | 12/2008 | Lee et al. |
| 2009/0008662 A1 | 1/2009 | Ashdown et al. |
| 2009/0050907 A1 | 2/2009 | Yuan et al. |
| 2009/0050908 A1 | 2/2009 | Yuan et al. |
| 2009/0050911 A1 | 2/2009 | Chakraborty |
| 2009/0050924 A1 | 2/2009 | Edmond |
| 2009/0057699 A1 | 3/2009 | Basin et al. |
| 2009/0057708 A1 | 3/2009 | Abdul Karim et al. |
| 2009/0072251 A1 | 3/2009 | Chan et al. |
| 2009/0095966 A1 | 4/2009 | Keller et al. |
| 2009/0108281 A1 | 4/2009 | Keller et al. |
| 2009/0114937 A1 | 5/2009 | Kawakubo |
| 2009/0129085 A1 | 5/2009 | Aizar et al. |
| 2009/0160363 A1 | 6/2009 | Negley et al. |
| 2009/0189178 A1 | 7/2009 | Kim et al. |
| 2009/0194775 A1 | 8/2009 | Chakraborty |
| 2009/0195189 A1 | 8/2009 | Zampini et al. |
| 2009/0201679 A1 | 8/2009 | Konaka |
| 2009/0212717 A1 | 8/2009 | Trattler |
| 2009/0231832 A1 | 9/2009 | Zukauskas et al. |
| 2009/0257240 A1 | 10/2009 | Koike |
| 2009/0267085 A1 | 10/2009 | Lee et al. |
| 2009/0283781 A1 | 11/2009 | Chan et al. |
| 2009/0283787 A1 | 11/2009 | Donofrio et al. |
| 2009/0316073 A1 | 12/2009 | Chen et al. |
| 2010/0014290 A1 | 1/2010 | Wilcox |

(56) References Cited

U.S. PATENT DOCUMENTS

| | | | |
|---|---|---|---|
| 2010/0025700 A1 | 2/2010 | Jung et al. |
| 2010/0044735 A1 | 2/2010 | Oyamada |
| 2010/0046231 A1 | 2/2010 | Medinis |
| 2010/0079059 A1 | 4/2010 | Roberts et al. |
| 2010/0103660 A1 | 4/2010 | van de Ven et al. |
| 2010/0149783 A1 | 6/2010 | Takenaka et al. |
| 2010/0155763 A1 | 6/2010 | Donofrio et al. |
| 2010/0193822 A1 | 8/2010 | Inobe et al. |
| 2010/0302786 A1 | 12/2010 | Wilcox et al. |
| 2011/0001149 A1 | 1/2011 | Chan et al. |
| 2011/0037084 A1 | 2/2011 | Sekii et al. |
| 2011/0049545 A1 | 3/2011 | Basin et al. |
| 2011/0075428 A1 | 3/2011 | Chen et al. |
| 2011/0095311 A1 | 4/2011 | Marchl et al. |
| 2011/0108874 A1 | 5/2011 | Chu et al. |
| 2011/0121345 A1 | 5/2011 | Andrews et al. |
| 2011/0164425 A1 | 7/2011 | Chen et al. |
| 2011/0186880 A1 | 8/2011 | Kohler et al. |
| 2011/0193118 A1 | 8/2011 | Oshima et al. |
| 2011/0222280 A1 | 9/2011 | Kim |
| 2011/0242807 A1 | 10/2011 | Little, Jr. et al. |
| 2011/0278617 A1 | 11/2011 | Lee |
| 2012/0075858 A1 | 3/2012 | Hsieh et al. |
| 2012/0134154 A1 | 5/2012 | Marchl et al. |
| 2012/0146066 A1 | 6/2012 | Tischler et al. |
| 2012/0235199 A1 | 9/2012 | Andrews et al. |
| 2012/0257386 A1 | 10/2012 | Harbers et al. |
| 2012/0268957 A1 | 10/2012 | Premysler |
| 2013/0056774 A1 | 3/2013 | Hong et al. |
| 2013/0063024 A1 | 3/2013 | Wada et al. |
| 2013/0328074 A1 | 12/2013 | Lowes et al. |
| 2013/0337591 A1 | 12/2013 | Chen |
| 2014/0027795 A1 | 1/2014 | Reiherzer et al. |
| 2014/0034986 A1 | 2/2014 | Bradley, Jr. et al. |
| 2014/0175473 A1 | 6/2014 | Donofrio et al. |
| 2014/0217443 A1 | 8/2014 | Heikman et al. |
| 2015/0137162 A1 | 5/2015 | Sabathil et al. |

FOREIGN PATENT DOCUMENTS

| | | | |
|---|---|---|---|
| CN | 1460393 A | 12/2003 |
| CN | 1470072 A | 1/2004 |
| CN | 2617039 Y | 5/2004 |
| CN | 1581527 A | 2/2005 |
| CN | 1591924 A | 3/2005 |
| CN | 1641899 A | 7/2005 |
| CN | 1671345 A | 9/2005 |
| CN | 1679168 A | 10/2005 |
| CN | 1744335 A | 3/2006 |
| CN | 1801498 A | 7/2006 |
| CN | 1874011 A | 12/2006 |
| CN | 1913135 A | 2/2007 |
| CN | 1977399 A | 6/2007 |
| CN | 1983590 A | 6/2007 |
| CN | 101005109 A | 7/2007 |
| CN | 101013689 A | 8/2007 |
| CN | 101217840 A | 7/2008 |
| CN | 101253813 A | 8/2008 |
| CN | 101271674 A | 9/2008 |
| CN | 201119078 Y | 9/2008 |
| CN | 101288341 A | 10/2008 |
| CN | 101360368 A | 2/2009 |
| CN | 101611502 A | 12/2009 |
| DE | 2315709 A1 | 10/1974 |
| DE | 19848078 A1 | 4/2000 |
| DE | 102005059362 A1 | 9/2006 |
| DE | 202007012162 U1 | 3/2008 |
| EP | 0684648 A2 | 11/1995 |
| EP | 0745668 A2 | 12/1996 |
| EP | 0936682 A1 | 8/1999 |
| EP | 1005085 A2 | 5/2000 |
| EP | 1187226 A1 | 3/2002 |
| EP | 1187227 A2 | 3/2002 |
| EP | 1187228 A1 | 3/2002 |
| EP | 1349202 A2 | 10/2003 |
| EP | 1418630 A1 | 5/2004 |
| EP | 1536487 A1 | 6/2005 |
| EP | 1538680 A2 | 6/2005 |
| EP | 1653254 A2 | 5/2006 |
| EP | 1653255 A2 | 5/2006 |
| EP | 1681509 A1 | 7/2006 |
| EP | 1693904 A2 | 8/2006 |
| EP | 1864780 A2 | 12/2007 |
| EP | 1953834 A1 | 8/2008 |
| EP | 2023407 A1 | 2/2009 |
| EP | 2056363 A2 | 5/2009 |
| EP | 2123775 A1 | 11/2009 |
| EP | 2123777 A1 | 11/2009 |
| EP | 2337072 A2 | 6/2011 |
| EP | 2341280 A2 | 7/2011 |
| FR | 2586844 A1 | 3/1987 |
| FR | 2759188 A1 | 8/1998 |
| GB | 2458972 A | 10/2009 |
| GB | 2466633 A | 7/2010 |
| JP | S53118019 A | 10/1978 |
| JP | S53126570 U | 10/1978 |
| JP | S5927559 A | 2/1984 |
| JP | S6148951 S | 3/1986 |
| JP | S6247156 A | 2/1987 |
| JP | S62160564 U | 10/1987 |
| JP | H03209781 A | 9/1991 |
| JP | H0545812 A | 2/1993 |
| JP | H06284942 A | 10/1994 |
| JP | H07202271 A | 8/1995 |
| JP | H07231120 A | 8/1995 |
| JP | H0832120 A | 2/1996 |
| JP | H08139257 A | 5/1996 |
| JP | H09246602 A | 9/1997 |
| JP | H1012915 A | 1/1998 |
| JP | H1054802 A | 2/1998 |
| JP | H10135492 A | 5/1998 |
| JP | H10261821 A | 9/1998 |
| JP | H10321909 A | 12/1998 |
| JP | H118405 A | 1/1999 |
| JP | H1154802 A | 2/1999 |
| JP | H11150306 A | 6/1999 |
| JP | H11167805 A | 6/1999 |
| JP | H11261113 A | 9/1999 |
| JP | 2000223751 A | 8/2000 |
| JP | 2000261041 A | 9/2000 |
| JP | 2001000043 A | 1/2001 |
| JP | 2001044506 A | 2/2001 |
| JP | 2001057446 A | 2/2001 |
| JP | 2001060072 A | 3/2001 |
| JP | 2001168400 A | 6/2001 |
| JP | 2001237463 A | 8/2001 |
| JP | 2001351404 A | 12/2001 |
| JP | 2002009217 A | 1/2002 |
| JP | 2002184207 A | 6/2002 |
| JP | 2002223005 A | 8/2002 |
| JP | 2002280479 A | 9/2002 |
| JP | 2002374005 A | 12/2002 |
| JP | 2003007946 A | 1/2003 |
| JP | 2003168305 A | 6/2003 |
| JP | 2003218405 A | 7/2003 |
| JP | 2003264267 A | 9/2003 |
| JP | 2003318449 A | 11/2003 |
| JP | 2003324214 A | 11/2003 |
| JP | 2004022862 A | 1/2004 |
| JP | 2004056075 A | 2/2004 |
| JP | 2004095580 A | 3/2004 |
| JP | 2004103775 A | 4/2004 |
| JP | 2004111937 A | 4/2004 |
| JP | 2004146815 A | 5/2004 |
| JP | 2004200236 A | 7/2004 |
| JP | 2004228387 A | 8/2004 |
| JP | 2004266168 A | 9/2004 |
| JP | 2004335740 A | 11/2004 |
| JP | 2004335880 A | 11/2004 |
| JP | 2004342870 A | 12/2004 |
| JP | 2005019838 A | 1/2005 |
| JP | 2005045199 A | 2/2005 |
| JP | 2005079167 A | 3/2005 |
| JP | 2005142311 A | 6/2005 |

(56) References Cited

FOREIGN PATENT DOCUMENTS

| | | |
|---|---|---|
| JP | 2005150624 A | 6/2005 |
| JP | 2005158957 A | 6/2005 |
| JP | 2005223222 A | 8/2005 |
| JP | 2005228695 A | 8/2005 |
| JP | 2005259754 A | 9/2005 |
| JP | 2005259972 A | 9/2005 |
| JP | 2005310935 A | 11/2005 |
| JP | 2005347401 A | 12/2005 |
| JP | 2006019557 A | 1/2006 |
| JP | 2006019598 A | 1/2006 |
| JP | 2006054329 A | 2/2006 |
| JP | 2006108517 A | 4/2006 |
| JP | 2006119357 A | 5/2006 |
| JP | 2006128512 A | 5/2006 |
| JP | 2006173271 A | 6/2006 |
| JP | 2006179520 A | 7/2006 |
| JP | 2006253689 A | 9/2006 |
| JP | 2006261039 A | 9/2006 |
| JP | 2006261375 A | 9/2006 |
| JP | 2006294898 A | 10/2006 |
| JP | 2006324331 A | 11/2006 |
| JP | 2006324589 A | 11/2006 |
| JP | 2006332234 A | 12/2006 |
| JP | 2006344690 A | 12/2006 |
| JP | 2006344692 A | 12/2006 |
| JP | 2007049172 A | 2/2007 |
| JP | 2007059207 A | 3/2007 |
| JP | 2007059260 A | 3/2007 |
| JP | 2007067103 A | 3/2007 |
| JP | 2007094088 A | 4/2007 |
| JP | 2007109836 A | 4/2007 |
| JP | 2007165029 A | 6/2007 |
| JP | 2007165840 A | 6/2007 |
| JP | 2007184542 A | 7/2007 |
| JP | 2007189239 A | 7/2007 |
| JP | 2007227679 A | 9/2007 |
| JP | 2007243226 A | 9/2007 |
| JP | 2007251214 A | 9/2007 |
| JP | 2007273763 A | 10/2007 |
| JP | 2007281323 A | 10/2007 |
| JP | 2007529105 A | 10/2007 |
| JP | 2007287981 A | 11/2007 |
| JP | 2007299905 A | 11/2007 |
| JP | 2007317896 A | 12/2007 |
| JP | 2007324608 A | 12/2007 |
| JP | 2007329516 A | 12/2007 |
| JP | 2008010691 A | 1/2008 |
| JP | 2008028171 A | 2/2008 |
| JP | 4279388 B2 | 6/2009 |
| TW | 541638 B | 7/2003 |
| TW | 546854 B | 8/2003 |
| TW | 200525775 A | 8/2005 |
| TW | 200616246 A | 5/2006 |
| TW | 200620718 A | 6/2006 |
| TW | 200633265 A | 9/2006 |
| WO | 9856043 A1 | 12/1998 |
| WO | 9931737 A1 | 6/1999 |
| WO | 0211212 A1 | 2/2002 |
| WO | 02097884 A1 | 12/2002 |
| WO | 03019072 A1 | 3/2003 |
| WO | 03044870 A1 | 5/2003 |
| WO | 200403660 A1 | 1/2004 |
| WO | 2004036660 A1 | 4/2004 |
| WO | 2004044877 A2 | 5/2004 |
| WO | 2004053933 A2 | 6/2004 |
| WO | 2005013365 A3 | 2/2005 |
| WO | 2005043627 A1 | 5/2005 |
| WO | 2006001221 A1 | 1/2006 |
| WO | 2006016326 A2 | 2/2006 |
| WO | 2006046981 A2 | 5/2006 |
| WO | 2006048064 A1 | 5/2006 |
| WO | 2006054228 A2 | 5/2006 |
| WO | 2006054228 A3 | 5/2006 |
| WO | 2006068297 A1 | 6/2006 |
| WO | 2006111805 A1 | 10/2006 |
| WO | 2006135005 A1 | 12/2006 |
| WO | 2006135502 A1 | 12/2006 |
| WO | 2007005844 A2 | 1/2007 |
| WO | 2007055455 A1 | 5/2007 |
| WO | 2007121486 A2 | 10/2007 |
| WO | 2007122516 A2 | 11/2007 |
| WO | 2007126720 A2 | 11/2007 |
| WO | 2007127029 A2 | 11/2007 |
| WO | 2007138698 A1 | 12/2007 |
| WO | 2008003176 A1 | 1/2008 |
| WO | 2008081794 A1 | 7/2008 |
| WO | 2008082098 A1 | 7/2008 |
| WO | 2009157999 A1 | 12/2009 |
| WO | 2010005294 A1 | 1/2010 |
| WO | 2010015825 A1 | 2/2010 |
| WO | 2010133772 A1 | 11/2010 |
| WO | 2012099145 A1 | 7/2012 |

OTHER PUBLICATIONS

Preliminary Notice of Reasons for Refusal for Japanese Application No. 2009-002857, dated Jul. 21, 2009.

Preliminary Notice of Reasons for Refusal for Japanese Application No. 2009-002857, dated Apr. 24, 2009, pp. 1-2.

Notice of Reasons for Rejection for Japanese Patent Application No. 2009-507195, dated Jun. 10, 2011.

Reasons for Rejection from Japanese Patent Application No. 2009-507195, dated May 8, 2012.

Decision of Rejection from Japanese Patent Application No. 2009-507195, dated May 21, 2013.

Decision of Rejection for Japanese Patent Application No. 2009-507195, dated May 21, 2013.

Reason for Rejection for Japanese Patent Application No. 2009-507195, dated Jul. 15, 2014.

Notice of Reasons of Rejection for Japanese Patent Application No. 2011-259253, dated May 28, 2013.

Notice of Reasons for Rejection for Japanese Patent Application No. 2011-259253, dated May 28, 2013.

Decision of Rejection for Japanese Patent Application No. 2011-259253, dated Mar. 25, 2014.

Notice of Reasons for Rejection for Japanese Patent Application No. 2011-259253, dated Feb. 3, 2015.

Reasons for Rejection for Japanese Patent Application No. 2011-510484, dated Aug. 7, 2012.

Notice of Reasons for Rejection for Japanese Patent Application No. 2011-512442, dated Aug. 7, 2012.

Office Action for Japanese Patent Application No. 2011-512442, dated Feb. 22, 2013.

Notice of Reasons for Rejection for Japanese Patent Application No. 2011-533175, dated Apr. 2, 2013.

Office Action for Japanese Patent Application No. 2011-533175, dated Jul. 25, 2013.

Office Action for Japanese Patent Application No. 2011-533175, dated Apr. 28, 2014.

Office Action for Japanese Patent Application No. 2011-533175, dated Apr. 28, 2015.

Trial Decision for Japanese Patent Application No. 2011-533175, mailed Oct. 27, 2015.

Notice of Reasons for Rejection for Japanese Patent Application No. 2011-534993, dated Mar. 12, 2013.

Notice of Reasons for Rejection for Japanese Patent Application No. 2011-534993, dated Nov. 12, 2013.

Reasons for Rejection for Japanese Patent Application No. 2011-534993, dated Oct. 7, 2014.

Decision of Patent Grant for Japanese Patent Application No. 2011-534993, mailed Dec. 24, 2014.

Decision of Rejection for Japanese Patent Application No. 2011-545616, dated Apr. 26, 2013.

Appeal Board's Questioning from Japanese Patent Application No. 2011-545616, mailed Nov. 12, 2013.

Decision on Appeal for Japanese Patent Application No. 2011-545616, mailed Jun. 27, 2014.

(56) References Cited

OTHER PUBLICATIONS

Notice of Completion of Pretrial Reexamination from Japanese Patent Application No. 2012-288000, mailed May 22, 2015.
Office Action for Japanese Patent Application No. 2012-288000, dated Oct. 8, 2013.
Decision of Rejection for Japanese Patent Application No. 2012-288000, dated Oct. 28, 2014.
Notice of Reasons for Rejection for Japanese Patent Application No. 2012-544480, dated Oct. 29, 2013.
Notice of Reasons for Rejection for Japanese Patent Application No. 2012-544480, dated Aug. 5, 2014.
Decision of Rejection for Japanese Patent Application No. 2012-544480, dated May 12, 2015.
Decision of Grant for Japanese Patent Application No. 2012-544480, dated May 31, 2016.
Office Action for Japanese Patent Application No. 2013-064671, dated Feb. 3, 2014.
Reasons for Rejection for Japanese Patent Application No. 2013-064671, dated Nov. 18, 2014.
Office Action for Japanese Patent Application No. 2013-064671, dated Jun. 2, 2015.
Notice of Reasons for Rejection for Japanese Patent Application No. 2013-064671, dated Jun. 2, 2015.
Decision of Rejection for Japanese Patent Application No. 2013-064671, dated Dec. 28, 2015.
Appeal Decision for Japanese Patent Application No. 2013-12017, mailed Nov. 25, 2014.
Appeal Decision for Japanese Patent Application No. 2013-18375, mailed Mar. 10, 2015.
Office Action for Japanese Patent Application No. 2013-18883, dated Feb. 24, 2015.
Office Action for Korean Patent Application No. 10-2004-7001033, dated Mar. 9, 2009.
Office Action for Korean Patent Application No. 10-2010-7028850, dated Feb. 17, 2015.
Office Action for Korean Patent Application No. 10-2011-7000240, dated Feb. 17, 2015.
Office Action for Russian Patent Application No. 2011146934/28, dated Feb. 28, 2014.
Decision to Grant from Russian Patent Application No. 20111146934/28, dated Aug. 14, 2014.
Office Action and Search Report for Taiwanese Patent Application No. 098109421, dated Aug. 22, 2014.
Office Action for Taiwanese Patent Application No. 098109421, dated Apr. 22, 2015.
Office Action for Taiwanese Patent Application No. 098109589, dated Feb. 18, 2014.
Office Action for U.S. Appl. No. 13/177,415, dated Jan. 8, 2015.
Office Action for U.S. Appl. No. 13/177,415, dated Oct. 16, 2015.
Office Action for U.S. Appl. No. 13/177,415, dated Jun. 8, 2015.
Office Action for U.S. Appl. No. 13/306,589, dated Feb. 20, 2013.
Office Action for U.S. Appl. No. 13/485,035, dated Jan. 22, 2013.
Office Action for U.S. Appl. No. 13/489,035, dated Aug. 5, 2013.
Office Action for U.S. Appl. No. 13/633,272, dated Dec. 31, 2014.
Office Action for U.S. Appl. No. 13/652,241, dated Sep. 11, 2013.
Office Action for U.S. Appl. No. 13/652,241, dated Mar. 12, 2014.
Office Action for U.S. Appl. No. 13/652,241, dated Nov. 19, 2014.
Office Action for U.S. Appl. No. 13/652,241, dated Mar. 17, 2015.
Office Action for U.S. Appl. No. 13/652,241, dated Mar. 10, 2016.
Office Action for U.S. Appl. No. 13/652,241, dated Sep. 11, 2015.
Office Action for U.S. Appl. No. 13/652,241, dated Sep. 29, 2016.
Office Action for U.S. Appl. No. 13/652,241, dated Jul. 1, 2016.
Office Action for U.S. Appl. No. 13/804,309, dated Mar. 10, 2015.
Office Action for U.S. Appl. No. 13/804,309, dated Mar. 24, 2017.
Office Action for U.S. Appl. No. 13/804,309, dated Oct. 11, 2017.
Office Action for U.S. Appl. No. 13/833,272, dated Sep. 24, 2015.
Office Action for U.S. Appl. No. 13/833,272, dated Aug. 23, 2016.
Office Action for U.S. Appl. No. 13/971,547, dated Nov. 6, 2013.
Office Action for U.S. Appl. No. 13/971,547, dated May 8, 2014.
Office Action for U.S. Appl. No. 14/329,807, dated Feb. 17, 2016.
Office Action for U.S. Appl. No. 14/329,807, dated Aug. 15, 2016.
Office Action for U.S. Appl. No. 14/478,571, dated Oct. 1, 2015.
Office Action for U.S. Appl. No. 14/478,571, dated Apr. 1, 2016.
Office Action for U.S. Appl. No. 14/478,571, dated Mar. 13, 2017.
Office Action for U.S. Appl. No. 14/478,571, dated Nov. 29, 2017.
Office Action for U.S. Appl. No. 14/478,571, dated Mar. 30, 2018.
Non-Final Office Action for U.S. Appl. No. 14/705,228, dated Jun. 17, 2016, 10 pages.
Final Office Action for U.S. Appl. No. 14/705,228, dated Nov. 25, 2016, 11 pages.
Non-Final Office Action for U.S. Appl. No. 14/705,228, dated Aug. 10, 2017, 12 pages.
Final Office Action for U.S. Appl. No. 14/705,228, dated Mar. 22, 2018, 13 pages.
Non-Final Office Action for U.S. Appl. No. 14/705,228, dated Dec. 12, 2018, 13 pages.
Final Office Action for U.S. Appl. No. 14/705,228, dated Apr. 22, 2020, 15 pages.
Advisory Action for U.S. Appl. No. 14/705,228, dated Jul. 2, 2020, 3 pages.
Notice of Allowance and Examiner-Initiated Interview Summary for U.S. Appl. No. 14/705,228, dated Sep. 8, 2020.
Office Action for Chinese Patent Application No. 2010106242824, dated Oct. 12, 2015.
Office Action for Chinese Patent Application No. 2010106242824, dated Sep. 5, 2016.
Office Action for Chinese Patent Application No. 2010106242824, dated Apr. 15, 2016.
Office Action for Chinese patent Application No. 2010106242824, dated Apr. 1, 2017.
First Office Action for Chinese Patent Application No. 201080001658.4, dated Sep. 24, 2012.
Decision of Rejection for Chinese Patent Application No. 201080001658.4, dated Jun. 20, 2013.
Notification of Reexamination for Chinese Patent Application No. 201080001658.4, dated Sep. 11, 2014.
First Office Action for Chinese Patent Application No. 201080027586.0, dated Feb. 8, 2014.
Second Office Action for Chinese Patent Application No. 201080027586.0, dated Sep. 16, 2014.
Third Office Action for Chinese Patent Application No. 201080027586.0, dated Jan. 21, 2015.
Fourth Office Action for Chinese Patent Application No. 201080027586.0, dated Jul. 29, 2015.
Second Office Action for Chinese Patent Application No. 201080062058.9, dated Dec. 31, 2014.
First Office Action for Chinese Patent Application No. 201110039138.9, dated Jun. 4, 2012.
Second Office Action for Chinese Patent Application No. 201110039138.9, dated Jan. 31, 2013.
Decision of Rejection for Chinese Patent Application No. 201110039138.9, dated Sep. 25, 2013.
Decision of Re-Examination for Chinese Patent Application No. 201110039138.9, dated Mar. 13, 2014.
Third Office Action for Chinese Patent Application No. 201110039138.9, dated Jun. 23, 2014.
Fourth Office Action for Chinese Patent Application No. 201110039138.9, dated Nov. 24, 2014.
First Office Action and Search Report for Chinese Patent Application No. 2011800428038, dated Jan. 21, 2015.
First Office Action for Chinese Patent Application No. 2011800511887, dated Apr. 30, 2015.
Second Office Action for Chinese Patent Application No. 201180051188.7, dated Nov. 3, 2015.
Notice of Allowance for Chinese Patent Application No. 201180051188.7, dated Feb. 3, 2016.
Second Office Action for Chinese Patent Application No. 201210046248.2, dated Apr. 15, 2014.
Third Office Action for Chinese Patent Application No. 2012100462482, dated Oct. 10, 2014.
First Office Action for Chinese Patent Application No. 201210492856.6, dated Jan. 5, 2015.

(56) References Cited

OTHER PUBLICATIONS

First Office Action for Chinese Patent Application No. 201230001815.3, dated Apr. 11, 2012.
Office Action for Chinese Patent Application No. 2012800586074, dated Mar. 17, 2016.
Office Action for Chinese Patent Application No. 2012800586074, dated Nov. 21, 2016.
Notice of Reasons for Rejection for Japanese Patent Application No. 2007-211901, dated Apr. 14, 2011.
Decision of Rejection for Japanese Patent Application No. 2007-211901, dated Jan. 30, 2012.
Notice of Reasons for Rejection for Japanese Patent Application No. 2007-211901, dated Apr. 9, 2013.
Notice of Reasons for Rejection for Japanese Patent Application No. 2007-211901, dated Oct. 8, 2013.
Notice of Reasons for Rejection for Japanese Patent Application No. 2007-228699, dated May 10, 2011.
Notice of Reasons for Rejection for Japanese Patent Application No. 2007-228699, dated May 8, 2012.
Notice of Reasons for Rejection for Japanese Patent Application No. 2007-228699, dated Mar. 6, 2013.
Decision of Rejection for Japanese Patent Application No. 2007-228699, dated Mar. 18, 2014.
Reexamination Report for Japanese Patent Application No. 2007-228699, dated Nov. 7, 2014.
Official Decision for Japanese Patent Application No. 2007-228699, dated Jan. 20, 2017.
Notice of Reasons for Rejection for Japanese Patent Application No. 2008-221738, dated Aug. 3, 2011.
Notice of Reasons for Rejection for Japanese Patent Application No. 2008-221738, dated May 2, 2012.
Decision of Rejection for Japanese Patent Application No. 2008-221738, dated Feb. 26, 2013.
Notice of Reconsideration for Japanese Patent Application No. 2008-221738, dated Jul. 9, 2013.
Office Action for Japanese Patent Application No. 2008-221738, dated Apr. 18, 2014.
Notice of Reasons for Rejection for Japanese Patent Application No. 2008-281533, dated Jun. 24, 2011.
Decision of Rejection for Japanese Patent Application No. 2008-281533, dated May 28, 2013.
Appeal Decision from Japanese Patent Application No. 2008-281533, dated Oct. 13, 2015.
Notice of Reasons for Rejection for Japanese Patent Application No. 2008-515699, dated May 19, 2011.
Decision of Rejection for Japanese Patent Application No. 2008-515699, dated Jul. 17, 2012.
Interrogation from Japanese Patent Application No. 2008-515699, mailed Feb. 19, 2013.
Appeal Decision for Japanese Patent Application No. 2008-515699, dated Sep. 20, 2013.
Office Action for U.S. Appl. No. 12/643,670, dated Jun. 25, 2013.
Office Action for U.S. Appl. No. 12/643,670, dated Mar. 31, 2014.
Office Action for U.S. Appl. No. 12/643,670, dated Oct. 15, 2014.
Office Action for U.S. Appl. No. 12/643,670, dated Apr. 24, 2015.
Office Action for U.S. Appl. No. 12/643,705, dated Jun. 13, 2012.
Office Action for U.S. Appl. No. 12/695,978, dated Dec. 20, 2010.
Office Action for U.S. Appl. No. 12/695,978, dated May 10, 2011.
Office Action for U.S. Appl. No. 12/695,978, dated Sep. 14, 2011.
Office Action for U.S. Appl. No. 12/695,978, dated Mar. 14, 2012.
Office Action for U.S. Appl. No. 12/695,978, dated Apr. 18, 2013.
Office Action for U.S. Appl. No. 12/695,978, dated Sep. 17, 2013.
Office Action for U.S. Appl. No. 12/695,978, dated Jan. 31, 2014.
Office Action for U.S. Appl. No. 12/695,978, dated Jul. 16, 2014.
Office Action for U.S. Appl. No. 12/757,179, dated Jan. 19, 2012.
Office Action for U.S. Appl. No. 12/757,179, dated Jul. 16, 2012.
Office Action for U.S. Appl. No. 12/757,891, dated May 9, 2012.
Office Action for U.S. Appl. No. 12/757,891, dated Jun. 18, 2013.
Office Action for U.S. Appl. No. 12/757,891, dated Jan. 14, 2014.
Office Action for U.S. Appl. No. 13/833,272, dated Jan. 6, 2016.
Office Action for U.S. Appl. No. 12/862,640, dated Jan. 24, 2013.
Office Action for U.S. Appl. No. 12/862,640, dated Apr. 30, 2013.
Office Action for U.S. Appl. No. 12/868,567, dated Sep. 12, 2012.
Office Action for U.S. Appl. No. 12/868,567, dated Feb. 22, 2013.
Office Action for U.S. Appl. No. 12/868,567, dated Jul. 5, 2013.
Office Action for U.S. Appl. No. 12/875,873, dated Jun. 19, 2012.
Office Action for U.S. Appl. No. 12/875,873, dated Feb. 21, 2013.
Office Action for U.S. Appl. No. 12/875,873, dated Jul. 3, 2013.
Office Action for U.S. Appl. No. 12/875,873, dated Oct. 18, 2013.
Office Action for U.S. Appl. No. 12/875,873, dated Feb. 25, 2014.
Office Action for U.S. Appl. No. 12/875,873, dated Jun. 25, 2014.
Office Action for U.S. Appl. No. 12/875,873, dated Oct. 3, 2014.
Office Action for U.S. Appl. No. 12/875,873, dated Mar. 2, 2015.
Office Action for U.S. Appl. No. 12/875,873, dated Jun. 29, 2015.
Office Action for U.S. Appl. No. 12/875,873, dated Jan. 29, 2016.
Office Action for U.S. Appl. No. 12/875,873, dated Aug. 12, 2016.
Office Action for U.S. Appl. No. 12/875,873, dated Feb. 9, 2017.
Office Action for U.S. Appl. No. 12/875,873, dated May 18, 2017.
Office Action for U.S. Appl. No. 12/875,873, dated Sep. 26, 2017.
Office Action for U.S. Appl. No. 12/875,873, dated Jan. 12, 2018.
Office Action for U.S. Appl. No. 12/875,873, dated May 29, 2018.
Office Action for U.S. Appl. No. 12/875,873, dated Aug. 28, 2018.
Office Action for U.S. Appl. No. 12/883,979, dated Sep. 12, 2011.
Notice of Allowance for U.S. Appl. No. 12/883,979, dated Mar. 19, 2012.
Office Action for U.S. Appl. No. 13/029,005, dated Jan. 24, 2013.
Office Action for U.S. Appl. No. 13/177,415, dated Jan. 25, 2013.
Office Action for U.S. Appl. No. 13/177,415, dated May 2, 2013.
Office Action for U.S. Appl. No. 13/177,415, dated Oct. 7, 2013.
Office Action for U.S. Appl. No. 13/177,415, dated May 7, 2014.
Office Action for U.S. Patent Application No. 12/069,827, dated Apr. 1, 2014.
Office Action for U.S. Appl. No. 12/069,827, dated Jul. 11, 2014.
Office Action from U.S. Appl. No. 12/069,827, dated Oct. 28, 2014.
Office Action for U.S. Appl. No. 12/069,827, dated Feb. 6, 2015.
Office Action for U.S. Appl. No. 12/069,827, dated Jun. 19, 2015.
Office Action for U.S. Appl. No. 12/069,827, dated Nov. 12, 2015.
Office Action for U.S. Appl. No. 12/069,827, dated Mar. 1, 2016.
Office Action for U.S. Appl. No. 12/069,827, dated Jul. 14, 2016.
Office Action for U.S. Appl. No. 12/152,766, dated Oct. 7, 2010.
Office Action for U.S. Appl. No. 12/152,766, dated Apr. 1, 2011.
Office Action for U.S. Appl. No. 12/152,766, dated Mar. 12, 2010.
Office Action for U.S. Appl. No. 12/154,691, dated Dec. 17, 2009.
Notice of Allowance for U.S. Appl. No. 12/154,691, dated Jun. 17, 2010.
Office Action for U.S. Appl. No. 12/156,995, dated Mar. 10, 2010.
Office Action for U.S. Appl. No. 12/156,995, dated Nov. 17, 2010.
Office Action for U.S. Appl. No. 12/156,995, dated Aug. 30, 2011.
Office Action for U.S. Appl. No. 12/156,995, dated Apr. 12, 2012.
Office Action for U.S. Appl. No. 12/156,995, dated Aug. 28, 2013.
Office Action for U.S. Appl. No. 12/228,957, dated Sep. 21, 2010.
Office Action for U.S. Appl. No. 12/288,957, dated Mar. 9, 2011.
Office Action for U.S. Appl. No. 12/288,957, dated Oct. 18, 2011.
Advisory Action for U.S. Appl. No. 12/288,957, dated Jan. 11, 2012.
Office Action for U.S. Appl. No. 12/288,957, dated Mar. 26, 2013.
Office Action for U.S. Appl. No. 12/288,957, dated Sep. 13, 2013.
Office Action for U.S. Appl. No. 12/288,957, dated Aug. 12, 2014.
Office Action for U.S. Appl. No. 12/288,957, dated Feb. 5, 2015.
Office Action for U.S. Appl. No. 12/288,957, dated Nov. 19, 2014.
Office Action for U.S. Appl. No. 12/288,957, dated Jul. 30, 2015.
Office Action for U.S. Appl. No. 12/291,293, dated May 18, 2010.
Office Action for U.S. Appl. No. 12/291,293, dated Sep. 3, 2010.
Office Action for U.S. Appl. No. 12/291,293, dated Mar. 1, 2011.
Office Action for U.S. Appl. No. 12/291,293, dated Jul. 19, 2011.
Office Action for U.S. Appl. No. 12/291,293, dated Feb. 28, 2013.
Office Action for U.S. Appl. No. 12/291,293, dated Aug. 20, 2013.
Office Action for U.S. Appl. No. 12/321,059, dated May 17, 2010.
Office Action for U.S. Appl. No. 12/321,059, dated Jun. 22, 2011.
Office Action for U.S. Appl. No. 12/321,059, dated Aug. 26, 2011.
Office Action for U.S. Appl. No. 12/321,059, dated Oct. 4, 2011.
Office Action for U.S. Appl. No. 12/321,059, dated Feb. 10, 2012.
Advisory Action for U.S. Appl. No. 12/321,059, dated Apr. 20, 2012.

(56) References Cited

OTHER PUBLICATIONS

Office Action for U.S. Appl. No. 12/544,131, dated Jan. 15, 2013.
Office Action for U.S. Appl. No. 12/614,989, dated Mar. 12, 2012.
Office Action for U.S. Appl. No. 12/629,735, dated Sep. 22, 2010.
Office Action for U.S. Appl. No. 12/629,735, dated Mar. 10, 2011.
Office Action for U.S. Appl. No. 12/629,735, dated Feb. 8, 2013.
Office Action for U.S. Appl. No. 12/629,735, dated Sep. 18, 2013.
Office Action for U.S. Appl. No. 12/629,735, dated Dec. 18, 2014.
Office Action for U.S. Appl. No. 12/629,735, dated Jul. 15, 2015.
Office Action for U.S. Appl. No. 12/635,818, dated Oct. 14, 2010.
Office Action for U.S. Appl. No. 12/643,670, dated Oct. 1, 2012.
Cree® XLamp® XQ-B LED Product Family Data Sheet from www.cree com/xlamp.
Cree® XL amp® XQ-D LED Product Family Data Sheet from www.cree. com/xlamp.
Cree® Xlamp® MC-E LEDS Product Info Sheets, pp. 1-3.
Cree, Inc. Cree®EZ1 OOO(TM) EZBright LED Data Sheet 2006, pp. 1-6.
Cree, Inc. Cree® XLamp® XR-E and XR-C LED Data Sheet, 2007, pp. 1-11.
Cree, Inc. Cree®EZ700™ EZBright LED Data Sheet, 2006, pp. 1-6.
Direct Attach DA1000 LEDs, Data Sheet, CPR3ES Rev A, Cree, www.cree com.
Direct Attach DA700 LEDs, Data Sheet, CPR3EU Rev, Cree, www.cree.com.
Direct Attach DA2432 LEDs, Data Sheet, CPR3FM Rev A, Cree, www.cree.com.
Direct Attach DA3547 LEDs, Data Sheet CPR3EL Rev D, Cree, www.cree.com.
Kim J.K et al. "Strongly Enhanced Phosphor Efficiency in GainN White Light-Emitting Diodes Using Remote Phosphor Configuration and Diffuse Reflector Cup," Japanese Journal of Applied Physics, Tokyo, Japan, vol. 44, No. 20-23, Jan. 1, 2005, pp. 649-651.
Lamina, Inc., Titan Turbo™ LED Light Engines, Data Sheet, 2008.
Luxeon Rebel Power Light Source Technical Datashee, DS56, dated Jul. 2007.
Luxeon Rebel Lumileds Reliability Datasheet, RD07, dated Mar. 2007.
Luxeon Rebel Assembly and Handling Information Appication Brief, AB32, Mar. 2007.
Nicha Corp, "White LED Part No. NSPW312BS," Specification for Nichia White LED, Model NSPW312BS, Jan. 14, 2004.
Nichia Corporation, "LEDS," Models NSSM016G, NSSM227, NESM026X, NSSM026BB, NESM005A, 9 Pages.
Sakai, et al., "Experimental Investigation of Dependence of Electrical Characteristics on Device Parameters in Trench MOS Barrier Shottky Diodes". Proceedings of 1998 International Symposium on Power Semiconductor Devices, Jun. 1998, pp. 293-296.
Satoshi Emoto, "How to make Mobile", [on line], May 30, 2001, Itmedia, www.itmedia.co.jp/mobile/rensai/howtomake/04.
T-Clad Thermal Substrates from the Berqquest Company, Chanhassen, Minnesota.
White Optics, LLC, "White 96 Advanced Coating," available at whiteoptics, com/whiteoptics-advanced-coatinqs/, New Castle, DE.
Zhang AP et al., "Comparison of GAN P-I-N and Schottky Rectifier Performance," IEEE Transactions on Electron Devices, IEEE Inc. New York, US vol. 48, No. 3 pp. 407-441 1, Mar. 2001.
Office Action for Canadian Patent Application No. 2454310, dated Feb. 9, 2010.
European Search Report for European Patent Application No. 07254498.4, dated Feb. 11, 2010.
Examination Report for European Patent Application No. 07840092. 6, dated May 4, 2015.
Extended Supplementary European Search Report for European Patent Application No. 07789665.2, dated Nov. 7, 2011.
Examination Report for European Patent Application No. 07789665. 2, dated Aug. 20, 2012.
Examination Report for European Patent Application No. 07789665. 2, dated Jan. 21, 2015.
Examination Report for European Patent Application No. 07789665. 2, dated Jul. 13, 2016.
Office Action for European Patent Application No. 07789665.2, dated Mar. 17, 2017.
Notification of Grant for European Patent Application No. 07789665. 2, dated May 4, 2017.
European Search Report for European Patent Application No. 08252829.0, dated Feb. 28, 2014.
Partial European Search Report for European Patent Application No. 08253519.6, dated Apr. 29, 2014.
Extended European Search Report for European Patent Application No. 08253519.6, dated Aug. 13, 2014.
Summons to Attend Oral Proceedings for European Patent Application No. 08253519.6, dated Nov. 19, 2020, 9 pages.
Examination Report for European Patent Application No. 08253519. 6, dated May 21, 2019, 7 pages.
Official Communication for European Patent Application No. 08253301. 9, dated Nov. 17, 2009.
European Search Report for European Patent Application No. 08253301.9, dated Feb. 24, 2009.
Examination Report for European Patent Application No. 08713656. 8, dated Oct. 18, 2017.
Examination Report for European Patent Application No. 09758647. 3, dated Jun. 21, 2011.
Examination Report for European Patent Application No. 09758647. 3, dated Jan. 24, 2011.
Extended Search Report for European Patent Application No. 09824413.0, dated Feb. 11, 2013.
Communication from European Patent Application No. 09824413. 0, dated Feb. 28, 2013.
Examination Report for European Patent Application No. 09824413. 0, dated May 16, 2014.
Summons to Attend Oral Hearing for European Patent Application No. 099145035, dated Apr. 30, 2015.
Search Report for European Patent Application No. 10731037.7, dated Dec. 11, 2013.
Supplemental European Search Report for European Patent Application No. 10731037.7, dated Jan. 9, 2014.
Examination Report for European Patent Application No. 10757645. 6, dated Jun. 28, 2013.
European Search Report for European Patent Application No. 10757645.6, dated Feb. 2, 2014.
Decision to Refuse for European Patent Application No. 10757645. 6, dated Oct. 27, 2015.
Office Action for Taiwanese Patent Application No. 098109589, dated Jul. 11, 2014.
Office Action for Taiwanese Patent Application No. 098136067, dated Jun. 26, 2014.
Office Action for Taiwanese Patent Application No. 098136067, dated Jan. 21, 2015.
Office Action for Taiwanese Patent Application No. 099105210, dated Oct. 20, 2014.
Office Action for Taiwanese Patent Application No. 099113616, dated Dec. 26, 2014.
Notice of Allowance for Taiwanese Patent Application No. 099113616, dated Sep. 2, 2015.
Office Action for Taiwanese Patent Application No. 099145035, dated Apr. 24, 2015.
Decision of Rejection for Taiwanese Patent Application No. 100130234, dated Feb. 22, 2016.
Examination Report for Taiwanese Patent Application No. 100130234, dated Jun. 24, 2015.
Notice of Allowance for Taiwanese Patent Application No. 100130234, dated Feb. 9, 2017.
Examination Report for Taiwanese Patent Application No. 100131665, dated Jul. 8, 2015.
Notice of Allowance for Taiwanese Patent Application No. 100131665, dated Dec. 15, 2015.
Notification of Allowance for Taiwanese U.S. Appl. No. 10/320,911, dated Jul. 16, 2014.
International Search Report and Written Opinion for International Patent Application No. PCT/US2007/086237, dated May 8, 2008.

(56) References Cited

OTHER PUBLICATIONS

International Search Report and Written Opinion for International Patent Application No. PCT/US2007/12403, dated Aug. 6, 2008.
International Search Report and Written Opinion for International Patent Application No. PCT/US2007/086242, dated Mar. 4, 2008.
International Search Report for PCT/US2008/004453, dated Sep. 9, 2008.
Invitation to Pay Additional Fees and Partial Search for International Patent Application No. PCT/US2009/001628, mailed Oct. 12, 2009.
International Search Report and Written Opinion for International Patent Application No. PCT/US2009/002155, dated Aug. 6, 2009.
International Search Report for PCT/CN2009/074800 dated Feb. 25, 2010.
International Search Report and Written Opinion for International Patent Application No. PCT/CN2010/001009, dated Oct. 1, 2010.
International Search Report and Written Opinion for International Patent Application No. PCT/US2010/001255, dated Aug. 13, 2010.
International Search Report and Written Opinion for International Patent Application No. PCT/CN2010/001852, dated Nov. 1, 2010.
International Search Report and Written Opinion for International Patent Application No. PCT/CN2010/001865, dated Jun. 9, 2011.
International Search Report and Written Opinion for International Patent Application No. PCT/US2010/003168, dated Apr. 26, 2011.
International Search Report and Written Opinion for International Patent Application No. PCT/US2010/003190, dated Apr. 6, 2011.
International Preliminary Report on Patentability for International Patent Application No. PCT/CN2010/070073, dated Apr. 28, 2011.
International Search Report and Written Opinion for International Patent Application No. PCT/US2011/001200, dated Apr. 27, 2012.
International Preliminary Report on Patentability for International Patent Application No. PCT/US2011/001200, dated Jan. 17, 2013.
International Search Report and Written Opinion for International Patent Application No. PCT/US2011/001457, dated Dec. 13, 2011.
International Search Report and Written Opinion for International Patent Application No. PCT/US2012/065060, dated Feb. 20, 2013.
International Preliminary Report on Patentability for International Patent Application No. PCT/US2012/065060, dated Jun. 12, 2014.
International Search Report and Written Opinion for International Patent Application No. PCT/US2013/038391, dated Aug. 8, 2013.
International Preliminary Report on Patentability for International Patent Application No. PCT/US2013/038391, dated Nov. 25, 2014.
International Search Report and Written Opinion for International Patent Application No. PCT/US2013/073921, dated Feb. 18, 2014.
International Prelliminary Report for International Patent Application No. PCT/US2013/073921, dated Jun. 25, 2015.
Notice of Allowance for U.S. Patent Application No. 10757645.6, dated Apr. 15, 2016.
Office Action for U.S. Appl. No. 11/149,998, dated Nov. 20, 2009.
Office Action for U.S. Appl. No. 11/149,998, dated May 18, 2010.
Office Action for U.S. Appl. No. 11/149,998, dated Aug. 27, 2010.
Office Action for U.S. Appl. No. 11/149,998, dated Jan. 24, 2011.
Office Action for U.S. Appl. No. 11/149,998, dated May 11, 2011.
Office Action for U.S. Appl. No. 11/149,998, dated Sep. 21, 2011.
Office Action for U.S. Appl. No. 11/149,998, dated Apr. 3, 2013.
Office Action for U.S. Appl. No. 11/149,998, dated Jul. 26, 2013.
Office Action for U.S. Appl. No. 11/465,120, dated Sep. 8, 2010.
Office Action for U.S. Appl. No. 11/465,120, dated Mar. 9, 2010.
Office Action for U.S. Appl. No. 11/465,120, dated Dec. 13, 2010.
Office Action for U.S. Appl. No. 11/465,120, dated Jun. 14, 2011.
Office Action for U.S. Appl. No. 11/465,120, dated Dec. 9, 2011.
Examination Report for European Patent Application No. 11748482.4, dated Nov. 16, 2015.
Examination Report for European Patent Application No. 11748482.4, dated Oct. 18, 2016.
Extended European Search Report for European Patent Application No. 13197857.9, dated Feb. 7, 2014.
Second Office Action for Chinese Patent Application No. 200480027969.2, dated Jul. 4, 2008.

First Office Action for Chinese Patent Application No. 200710142217.6, dated Jun. 22, 2009.
Second Office Action from Chinese Patent Application No. 200710142217.6, dated Nov. 6, 2009.
Office Action for Chinese Patent Application No. 200710142310.7, dated Dec. 11, 2009.
First Office Action for Chinese Patent Application No. 200710152109.7, dated Jul. 29, 2011.
Third Office Action for Chinese Patent Application No. 200710152109.7, dated Mar. 5, 2013.
Fourth Office Action for Chinese Patent Application No. 200710152109.7, dated Jun. 28, 2013.
Fifth Office Action for Chinese Patent Application No. 200710152109.7, dated Jan. 6, 2014.
Decision on Rejection for Chinese Patent Application No. 2007101521097, dated Mar. 17, 2014.
Notice of Re-examination for Chinese Patent Application No. 200710152109.7, dated Jun. 9, 2015.
Reexamination Decision for Chinese Patent Application No. 200710152109.7, dated Nov. 26, 2015.
First Office Action for Chinese Patent Application No. 200780019643.9, dated Mar. 29, 2010.
Second Office Action for Chinese Patent Application No. 200880009255.7, dated Oct. 13, 2011.
Decision of Rejection for Chinese Patent Application No. 200880009255.7, dated Sep. 5, 2012.
Notification of Reexamination for Chinese Patent Application No. 200880009255.7, dated May 12, 2014.
Decision of Re-Examination for Chinese Patent Application No. 200880009255.7, dated Oct. 22, 2014.
Third Office Action for Chinese Patent Application No. 200880009255.7, dated Jan. 12, 2015.
Notification of First Office Action for Chinese Patent Application No. 200880009255.7, dated Sep. 26, 2010.
First Office Action for Chinese Patent Application No. 200910145412.3, dated Apr. 28, 2012.
Sixth Office Action for Chinese Patent Application No. 2009601423528, dated Apr. 1, 2016.
First Office Action for Chinese Patent Application No. 200980125244.X, dated May 28, 2012.
Search Report for Chinese Patent Application No. 200980125244.X, dated Nov. 5, 2012.
Second Office Action for Chinese Patent Application No. 200980125244.X, dated Nov. 26, 2012.
Third Office Action for Chinese Patent Application No. 200980125244.X, dated May 31, 2013.
Decision of Rejection for Chinese Patent Application No. 200980125244.X, dated Jan. 13, 2014.
Notification of Reexamination for Chinese Patent Application No. 200980125244.X, dated Mar. 2, 2015.
Notification of Reexamination for Chinese Patent Application No. 200980125244.X, dated Oct. 15, 2015.
First Office Action for Chinese Patent Application No. 200980125251, dated Aug. 8, 2013.
Search Report for Chinese Patent Application No. 200980125251, dated Jul. 31, 2013.
Third Office Action for Chinese Patent Application No. 200980125251, dated Oct. 31, 2014.
First Office Action for Chinese Patent Application No. 200980142352.8, dated Aug. 27, 2012.
Second Office Action for Chinese Patent Application No. 200980142352.8, dated May 6, 2013.
Third Office Action and Search Report for Chinese Patent Appl. No. 200980142352.8 dated Nov. 26, 2013.
Fourth Office Action for Chinese Patent Application No. 200980142352.8, dated May 29, 2014.
Fifth Office Action for Chinese Patent Application No. 200980142352.8, dated Dec. 31, 2014.
Decision of Rejection for Chinese Patent Application No. 200980142352.8, dated Jul. 14, 2015.
Office Action for Chinese Patent Application No. 2009801423528, dated Sep. 21, 2016.

(56) References Cited

OTHER PUBLICATIONS

Decision of Reexamination for Chinese Patent Application No. 200980142352.8, dated Dec. 2, 2015.
First Office Action for Chinese Patent Application No. 200980153995.2, dated May 4, 2012.
First Office Action for Chinese Patent Application No. 201010167346.2, dated Feb. 29, 2012.
Second Office Action for Chinese Patent Application No. 201010167346.2, dated Feb. 17, 2013.
Decision of Rejection for Chinese Patent Application No. 201001067346.2, dated Aug. 30, 2013.
Decision of Rejection for Chinese Patent Application No. 201010167346.2, dated Jun. 20, 2017.
Notification of Reexamination for Chinese Patent Application No. 2010101673462, dated Jan. 12, 2015.
Office Action for Chinese Patent Application No. 2010101673462, dated Apr. 26, 2016.
First Office Action for Chinese Patent Application No. 2010106242824, dated Feb. 17, 2015.
Second Office Action for Chinese Patent Application No. 2010106242824, dated Dec. 29, 2015.
Intention to Grant for European Patent Application No. 08253519.6, dated Jun. 1, 2021, 7 pages.
Intention to Grant for European Patent Application No. 08253519.6, dated Aug. 11, 2021, 8 pages.
Office Action for U.S. Appl. No. 11/496,922, dated Jun. 10, 2010.
Office Action for U.S. Appl. No. 11/496,922, dated Dec. 15, 2010.
Office Action for U.S. Appl. No. 11/496,922, dated Jul. 5, 2011.
Office Action for U.S. Appl. No. 11/496,922, dated Feb. 9, 2012.
Advisory Action for U.S. Appl. No. 11/496,922, dated Apr. 18, 2012.
Office Action for U.S. Appl. No. 11/496,922, dated Nov. 23, 2012.
Office Action for U.S. Appl. No. 11/496,922, dated Jun. 26, 2013.
Office Action for U.S. Appl. No. 11/496,922, dated Oct. 9, 2013.
Office Action for U.S. Appl. No. 11/600,617, dated Dec. 22, 2009.
Office Action for U.S. Appl. No. 11/982,275, dated Sep. 18, 2012.
Office Action for U.S. Appl. No. 11/982,276, dated Feb. 22, 2012.
Office Action for U.S. Appl. No. 11/982,276, dated May 9, 2013.
Office Action for U.S. Appl. No. 11/982,276, dated Aug. 7, 2012.
Office Action for U.S. Appl. No. 11/982,276, dated Oct. 10, 2012.
Office Action for U.S. Appl. No. 11/982,276, dated May 29, 2013.
Office Action for U.S. Appl. No. 11/982,276, dated Oct. 25, 2013.
Office Action for U.S. Appl. No. 11/982,276, dated Oct. 23, 2014.
Office Action for U.S. Appl. No. 11/982,276, dated Apr. 16, 2015.
Office Action for U.S. Appl. No. 11/982,276, dated Feb. 4, 2016.
Office Action for U.S. Appl. No. 11/982,276, dated Aug. 18, 2016.
Office Action for U.S. Appl. No. 12/002,410, dated Apr. 26, 2011.
Office Action for U.S. Appl. No. 12/002,410, dated May 25, 2010.
Office Action for U.S. Appl. No. 12/002,410, dated Dec. 13, 2010.
Office Action for U.S. Appl. No. 12/002,410, dated Mar. 28, 2012.
Office Action for U.S. Appl. No. 12/002,410, dated Sep. 25, 2012.
Office Action for U.S. Appl. No. 12/002,410, dated Jan. 29, 2013.
Office Action for U.S. Appl. No. 12/002,410, dated Sep. 10, 2013.
Office Action for U.S. Appl. No. 12/002,410, dated Feb. 4, 2014.
Office Action for U.S. Appl. No. 12/002,410, dated May 20, 2014.
Office Action for U.S. Appl. No. 12/002,410, dated Nov. 4, 2014.
Office Action for U.S. Appl. No. 12/002,410, dated Feb. 23, 2015.
Office Action for U.S. Appl. No. 12/002,410, dated Jun. 17, 2015.
Office Action for U.S. Appl. No. 12/002,410, dated Nov. 12, 2015.
Office Action for U.S. Appl. No. 12/002,410, dated Jun. 14, 2016.
Office Action for U.S. Appl. No. 12/002,410, dated Jun. 30, 2017.
Office Action for U.S. Appl. No. 12/002,410, dated Nov. 3, 2017.
Office Action for U.S. Appl. No. 12/002,410, dated Mar. 29, 2018.
Office Action for U.S. Appl. No. 12/069,827, dated Oct. 29, 2010.
Office Action for U.S. Appl. No. 12/069,827, dated Apr. 20, 2010.
Office Action for U.S. Appl. No. 12/069,827, dated Jan. 27, 2011.
Office Action for U.S. Appl. No. 12/069,827, dated Jun. 16, 2011.
Office Action for U.S. Appl. No. 12/069,827, dated Oct. 26, 2011.
Office Action for U.S. Appl. No. 12/069,827, dated Apr. 3, 2012.
Office Action for U.S. Appl. No. 12/069,827, dated Dec. 6, 2012.
Office Action for U.S. Appl. No. 12/069,827, dated Aug. 9, 2012.
Office Action for U.S. Appl. No. 12/069,827, dated Jun. 5, 2013.
Office Action for U.S. Appl. No. 12/069,827, dated Mar. 5, 2013.
Office Action for U.S. Appl. No. 12/069,827, dated Jul. 3, 2013.
Office Action for U.S. Appl. No. 12/069,827, dated Oct. 25, 2013.

* cited by examiner

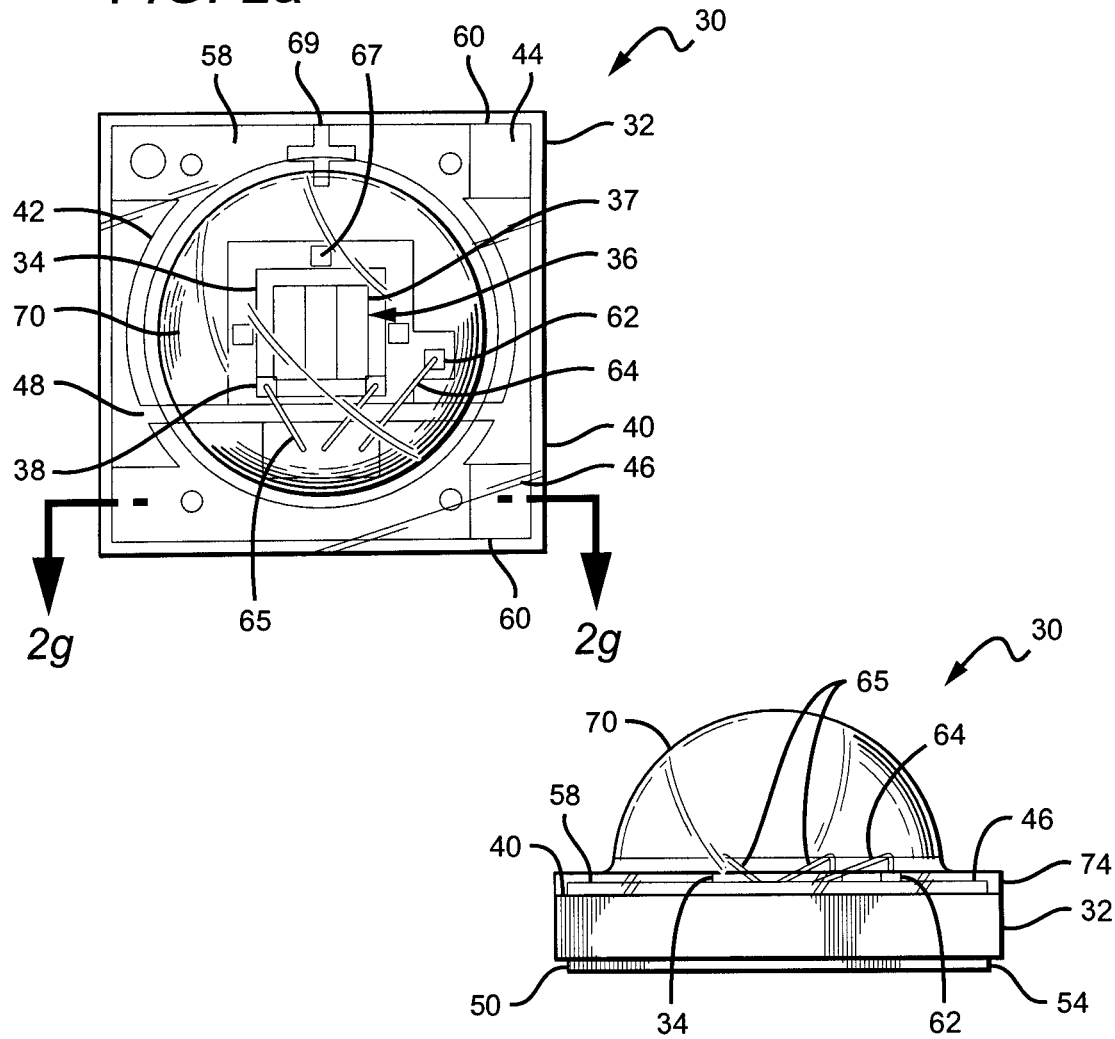
FIG. 2a
FIG. 2b
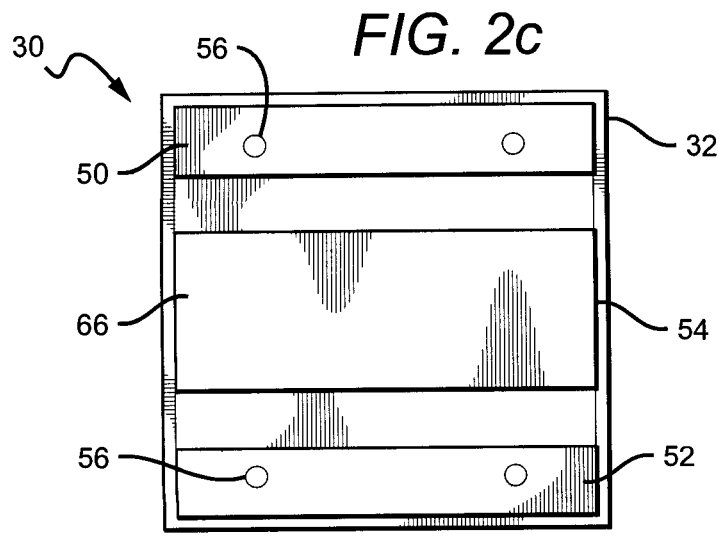
FIG. 2c

FIG. 7a
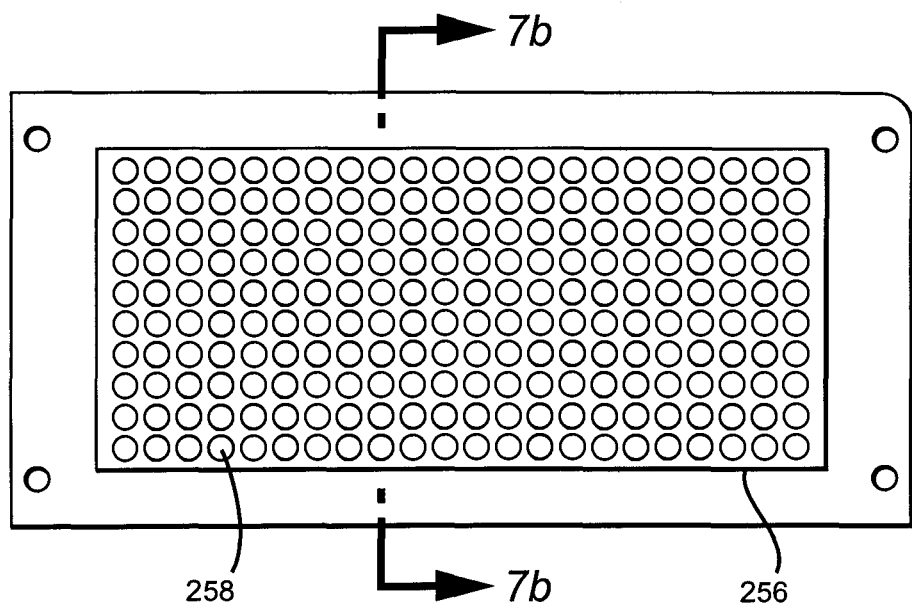
258    7b    256
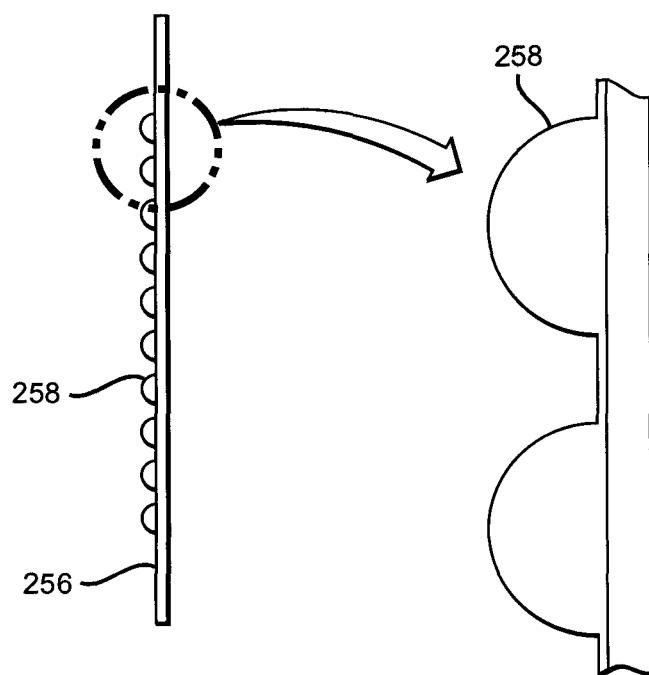
258
258
256
FIG. 7b

LIGHT EMITTING DIODE PACKAGE AND METHOD FOR FABRICATING SAME

This application is a continuation of U.S. patent application Ser. No. 14/705,228, filed on May 6, 2015, now U.S. Pat. No. 10,892,383, which is a divisional of, and claims the benefit of, U.S. patent application Ser. No. 11/982,275 to Keller et al., filed on Oct. 31, 2007, now U.S. Pat. No. 9,070,850.

BACKGROUND OF THE INVENTION

Field of the Invention

This invention relates to light emitting diodes, and in particular to light emitting diode packages having a molded lens.

Description of the Related Art

Light emitting diodes (LED or LEDs) are solid state devices that convert electric energy to light, and generally comprise one or more active layers of semiconductor material sandwiched between oppositely doped layers. When a bias is applied across the doped layers, holes and electrons are injected into the active layer where they recombine to generate light. Light is emitted from the active layer and from all surfaces of the LED.

In order to use an LED chip in a circuit or other like arrangement, it is known to enclose an LED chip in a package to provide environmental and/or mechanical protection, color selection, focusing and the like. An LED package also includes electrical leads, contacts or traces for electrically connecting the LED package to an external circuit. In a typical LED package 10 illustrated in FIG. 1A, an LED chip 12 is mounted on a reflective cup 13 by means of a solder bond or conductive epoxy. One or more wire bonds 11 connect the ohmic contacts of the LED chip 12 to leads 15A and/or 15B, which may be attached to or integral with the reflective cup 13. The reflective cup may be filled with an encapsulant material 16 containing a wavelength conversion material such as a phosphor. Light emitted by the LED at a first wavelength may be absorbed by the phosphor, which may responsively emit light at a second wavelength. The entire assembly is then encapsulated in a clear protective resin 14, which may be molded in the shape of a lens to collimate the light emitted from the LED chip 12. While the reflective cup 13 may direct light in an upward direction, optical losses may occur when the light is reflected (i.e. some light may be absorbed by the reflector cup instead of being reflected). In addition, heat retention may be an issue for a package such as the package 10 shown in FIG. 1A, since it may be difficult to extract heat through the leads 15A, 15B.

A conventional LED package 20 illustrated in FIG. 1B may be more suited for high power operations which may generate more heat. In the LED package 20, one or more LED chips 22 are mounted onto a carrier such as a printed circuit board (PCB) carrier, substrate or submount 23. A metal reflector 24 mounted on the submount 23 surrounds the LED chip(s) 22 and reflects light emitted by the LED chips 22 away from the package 20. The reflector 24 also provides mechanical protection to the LED chips 22. One or more wirebond connections 11 are made between ohmic contacts on the LED chips 22 and electrical traces 25A, 25B on the carrier 23. The mounted LED chips 22 are then covered with an encapsulant 26, which may provide environmental and mechanical protection to the chips while also acting as a lens. The metal reflector 24 is typically attached to the carrier by means of a solder or epoxy bond.

While a package such as the package 20 illustrated in FIG. 1B may have certain advantages for high power operation, there may be a number of potential problems associated with using a separate metal piece as a metal reflector. For example, small metal parts may be difficult to manufacture repeatable with a high degree of precision at a reasonable expense. In addition, since the reflector is typically affixed to a carrier using an adhesive, several manufacturing steps may be required to carefully align and mount the reflector, which may add to the expense and complexity of the manufacturing process for such packages.

For higher powered operation it may also be difficult to transfer dissipate heat generated by the LED chip 22. Submounts can be made of materials such as ceramics that are robust but do not efficiently conduct heat. Heat from the LED chip passes into the submount below the LED chip, but does not efficiently spread outward from below the LED where it can then dissipate. Heat from the LED tends to localize below the LED and can increase as operation of the LED package. This increased heat can result is reduced lifetime or failure of the package.

SUMMARY OF THE INVENTION

One embodiment of an LED package according to the present invention comprises a submount having a top and bottom surface with a plurality of top electrically and thermally conductive elements on its top surface. An LED is included on one of the top elements such that an electrical signal applied to the top elements causes the LED to emit light. The electrically conductive elements also spread heat from the LED across the majority of the submount top surface. A bottom thermally conductive element is included on the bottom surface of said submount and conducts heat from the submount. A lens is formed directly over the LED.

Another embodiment of an LED package according to the present invention comprises a submount having a top and bottom surface with an attach pad on the top surface, a first contact pad on the top surface is integral to the attach pad, and a second contact pad on the top surface. An LED is mounted to the attach pad, and when an electrical signal is applied to the first and second contact pads causing the LED to emit light. The pads also comprise thermally conductive layers covering most of the top surface to spread heat from the LED to the majority of the top surface. An optical element is formed directly over said LED.

Another embodiment of an LED package according to the present invention comprises, a submount having a top and bottom surface, with an LED mounted on the top surface. A lens is formed directly on the LED and a portion of the top surface. A top heat spreading element on the top surface spreads heat from the LED across the majority of the top surface, and a bottom heat spreading element on the bottom surface of the submount that conducts heat from the submount.

One embodiment of a method for fabricating LED packages according to the present invention, comprises providing a submount panel sized to be separated into a plurality of LED package submounts. Top conductive elements are formed on one surface of the submount panel for a plurality of LED packages. LEDs are attached to the top elements with the LEDs electrically connected to the top conductive elements. Lenses are molded over the LEDs and the substrate panel is singulated to separate it into a plurality of LED packages.

A method for fabricating a plurality of surface mount LED packages according to the present invention, comprises providing a submount panel sized to accommodate formation of a plurality of LED packages. Sets of attach pads and contact pads are formed on one surface of the submount panel, with each of the sets corresponding to one of the LED packages to be formed from said submount panel. A plurality of LEDs are attached to the submount panel with each of the LEDs attached and electrically connected to one of the sets of attach pads and contact pads. A plurality of lenses are molded on the submount panel with each of the lenses over one of the LEDs. Sets of surface mount contacts are formed on the surface of the submount panel opposite the sets of attach pads and contact pads, each of the sets of surface mount contacts corresponding to a respective one of the sets of attach pads and contact pads. The substrate panel is singulated to separate it into a plurality of LED packages.

These and other aspects and advantages of the invention will become apparent from the following detailed description and the accompanying drawings which illustrate by way of example the features of the invention.

BRIEF DESCRIPTION OF THE DRAWINGS

FIG. 2a is a top view of one embodiment of an LED package according to the present invention;

FIG. 2b is a side view of the LED package shown in FIG. 2a;

FIG. 2c is a bottom view of the LED package shown in FIG. 2a;

FIG. 2d is an upper perspective view of the LED package shown in FIG. 2a;

FIG. 2e is a bottom perspective view of the LED package shown in FIG. 2a;

FIG. 2f is an exploded view of the LED package shown in FIG. 2a;

FIG. 3b is top view of the LED package shown in FIG. 3a;

FIG. 3c is a bottom view of the LED package shown in FIG. 3a;

FIG. 3d is an upper perspective view of the LED package shown in FIG. 3a;

FIG. 3e is a bottom perspective view of the LED package shown in FIG. 3a;

FIG. 4b is a bottom perspective view of the LED package shown in FIG. 2a;

FIG. 6b is another sectional view of the lens mold shown in FIG. 5a;

FIG. 7a is a plan view of one embodiment of a submount panel with lenses arranged according to the present invention; and FIG. 7b is a sectional view of the submount panel taken in FIG. 7a taken along section lines 7b-7b.

DETAILED DESCRIPTION OF THE INVENTION

Figure 1A:
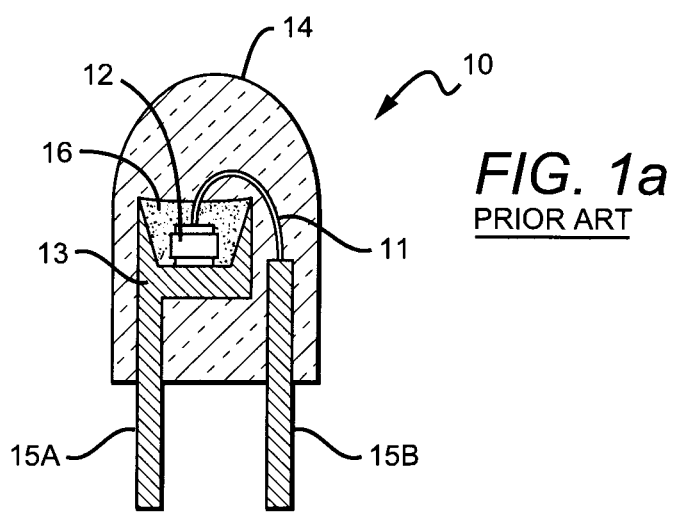
FIG. 1A is a sectional view of a prior art LED package.
Figure 1B:
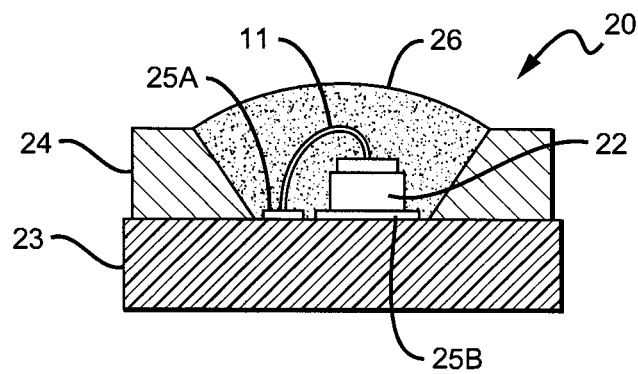
FIG. 1B is a sectional view of another prior art LED package.
Figure 2G:
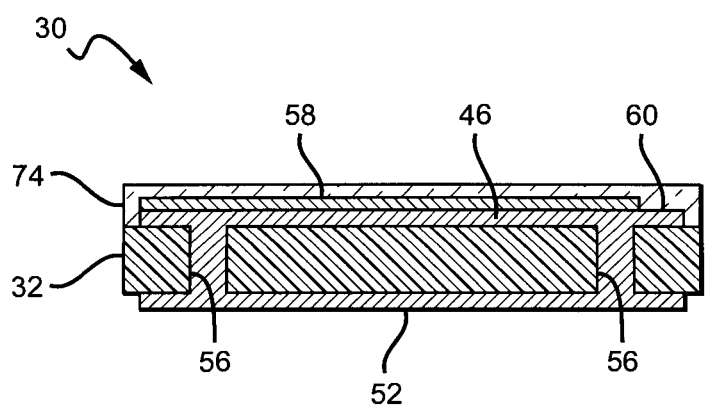
FIG. 2g is a sectional view of the LED package shown in FIG. 2a, taken along section lines 2g-2g.
Figure 2D:
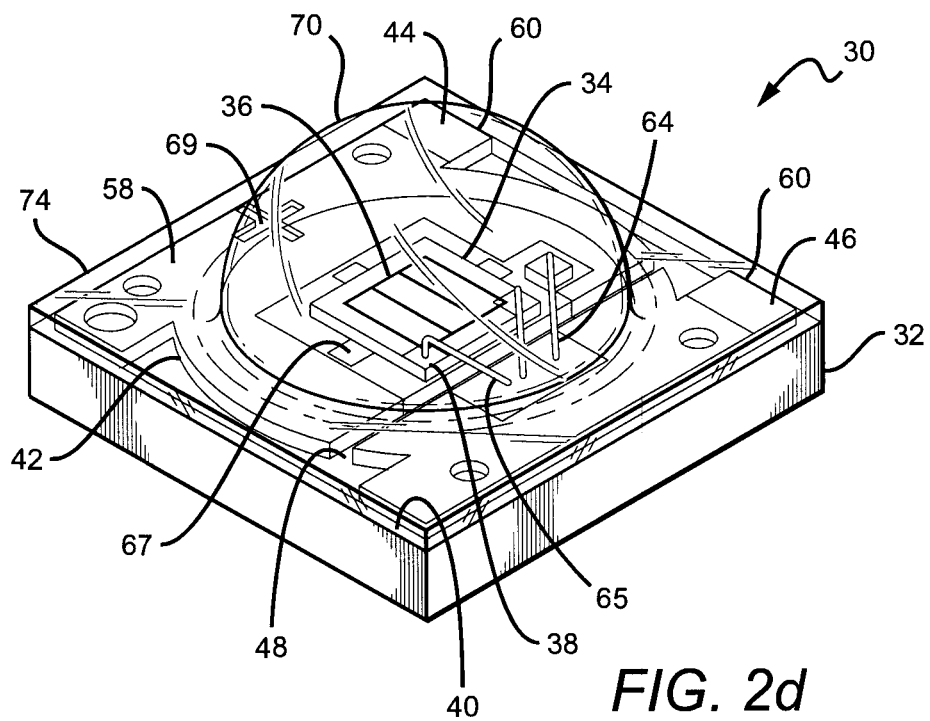
Figure 2E:
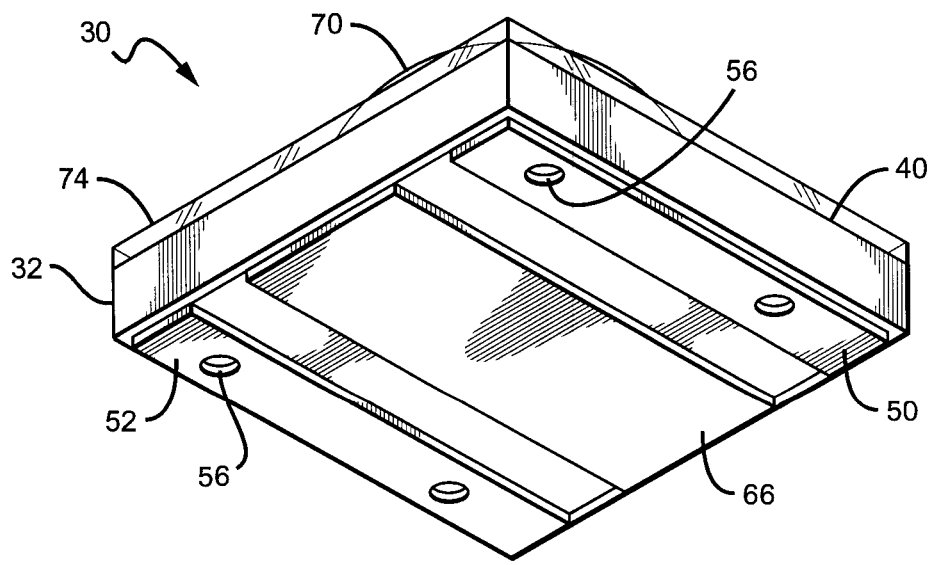
Figure 2F:
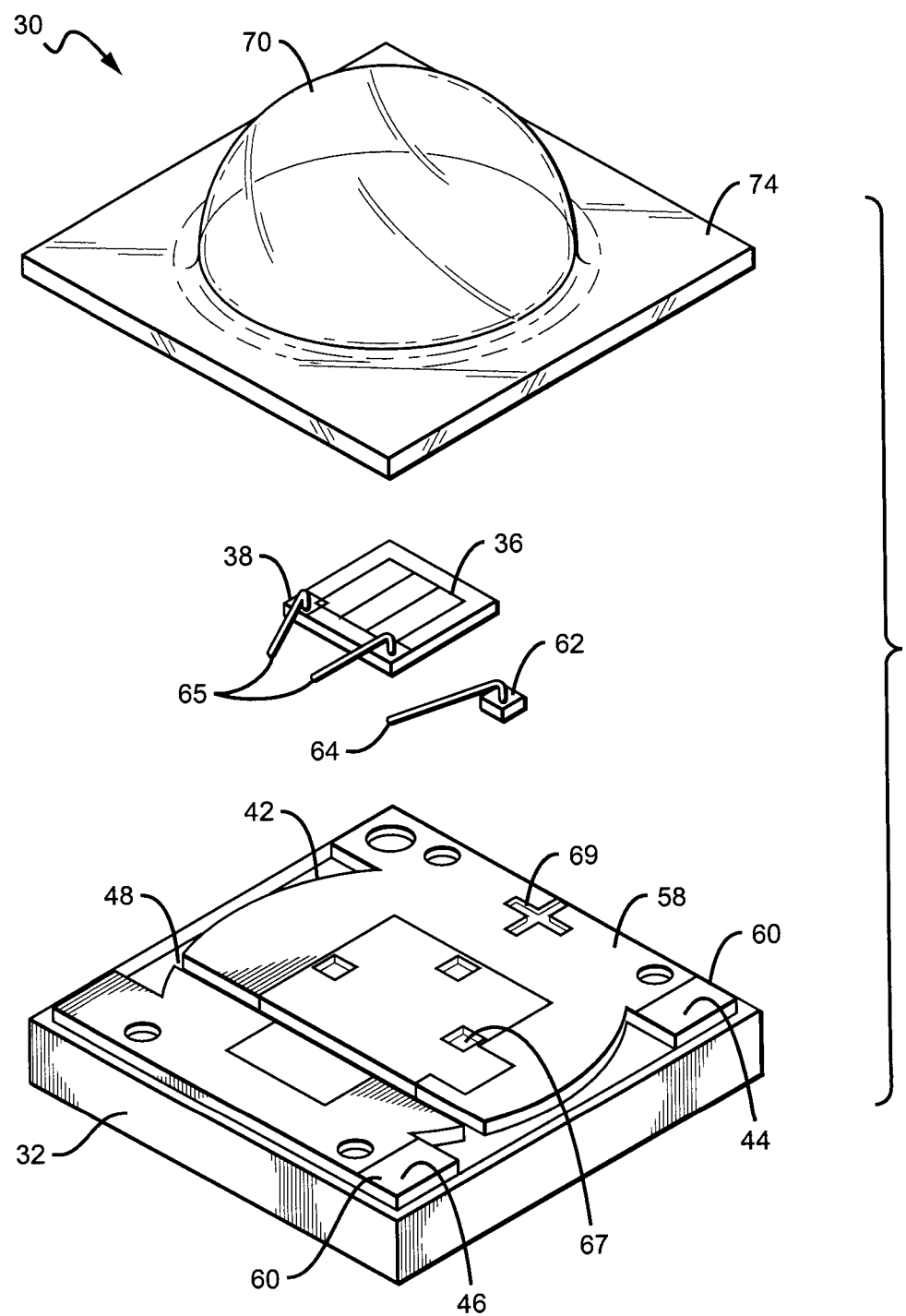
Figure 3A:
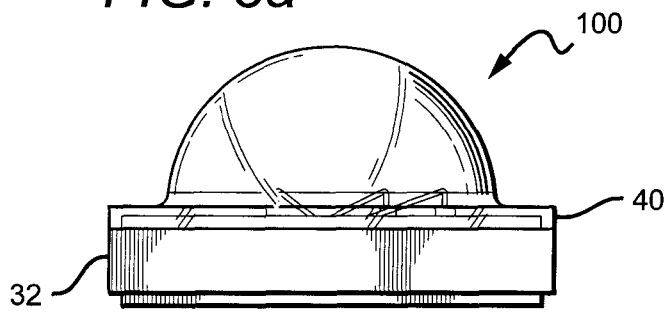
FIG. 3a is a side view of another embodiment of an LED package according to the present invention.
Figure 3B:
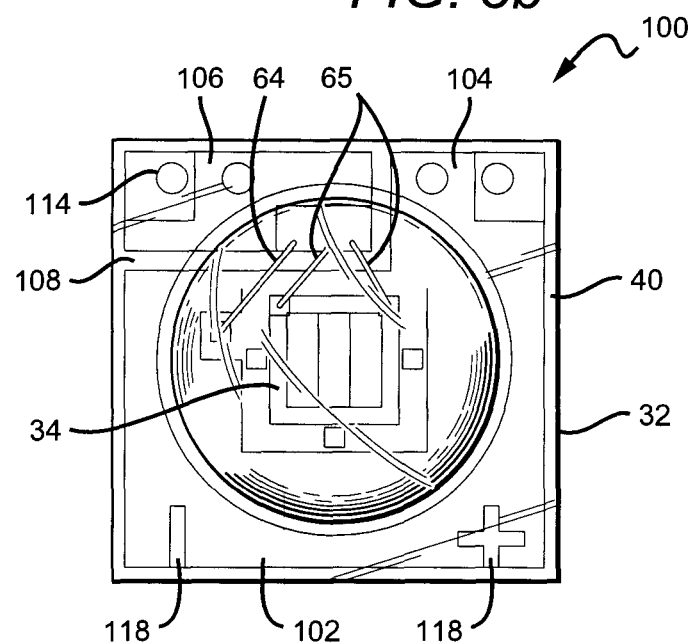
Figure 3C:
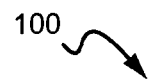
Figure 3D:
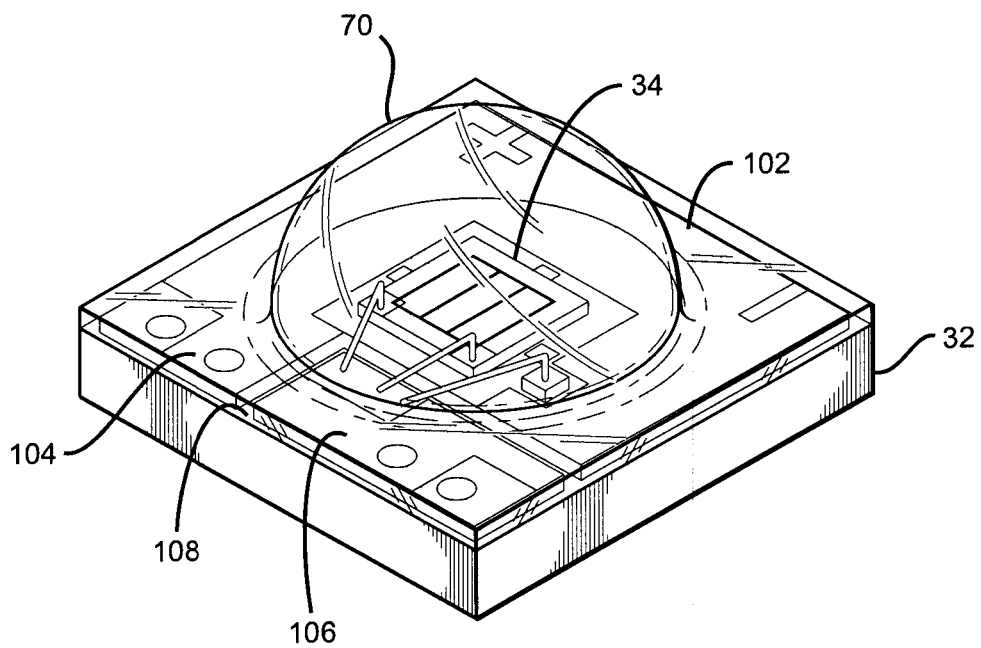
Figure 3E:
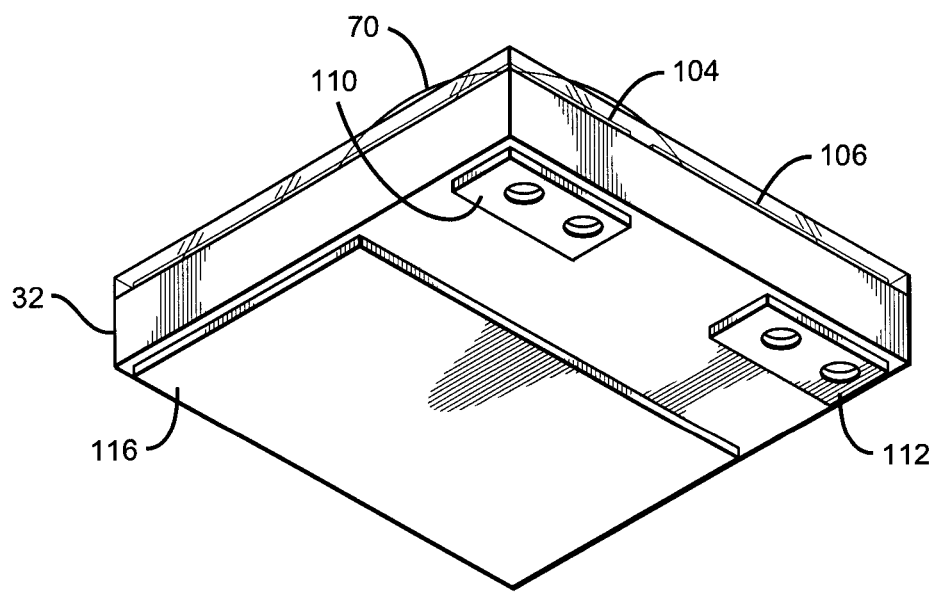

The present invention is directed to compact, simple and efficient LED packages and methods for manufacturing same. Different embodiments can comprise one or more high power LEDs that typically operate at elevated temperatures. Packages according to the present invention can include features to provide for improved thermal management by spreading the heat from the LED. The heat can then dissipate into the ambient. The packages according to the present invention can also comprise a lens molded directly over the one or more LEDs to protect the LED while still allowing for efficient emission characteristics.

The present invention is also directed to methods for fabricating LED packages using processing steps that allow for the simultaneous formation of a plurality of packages. This can reduce the manufacturing complexity and cost of LED package fabrication.

The present invention provides low cost, relatively small size LED packages that provide an efficient but small light source. The packages according to the present invention are particularly adapted to surface mount technologies and provide features that allow for the good thermal dissipation, allowing the packages to operate at elevated power levels without overheating.

It is understood that when an element such as a layer, region or substrate is referred to as being "on" another element, it can be directly on the other element or intervening elements may also be present. Furthermore, relative terms such as "inner", "outer", "upper", "above", "lower", "beneath", and "below", and similar terms, may be used herein to describe a relationship of one layer or another region. It is understood that these terms are intended to encompass different orientations of the device in addition to the orientation depicted in the figures.

Although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Embodiments of the invention are described herein with reference to cross-sectional view illustrations that are schematic illustrations of idealized embodiments of the invention. As such, variations from the shapes of the illustrations as a result, for example, of manufacturing techniques and/or tolerances are expected. Embodiments of the invention should not be construed as limited to the particular shapes of the regions illustrated herein but are to include deviations in shapes that result, for example, from manufacturing. A region illustrated or described as square or rectangular will typically have rounded or curved features due to normal manufacturing tolerances. Thus, the regions illustrated in the figures are schematic in nature and their shapes are not intended to illustrate the precise shape of a region of a device and are not intended to limit the scope of the invention.

The present invention can be used in with many different solid state emitters with the embodiments of the invention below being described in relation to LEDs, and in particular to white emitting LEDs and LED packages. It is understood that the present invention can also use other solid state emitter packages beyond the embodiment shown. The present invention can also be used with multiple emitter packages, such as LED packages having more than one LED. The present invention can be used in any application wherein a conversion material is used to down-convert the wavelength of light from an emitter, and the discussion of the present invention with reference to the following embodiment should not be construed as limiting to the that particular embodiment or similar embodiments.

FIGS. 2a through 2g show one embodiment of an LED package 30 according to the present invention generally comprising a substrate/submount ("submount") 32 with one or more LEDs emitting the same or different colors. In the embodiment shown, a single LED 34 is mounted on the submount 32. The LED 34 can have many different semiconductor layers arranged in different ways. LED structures and their fabrication and operation are generally known in the art and only briefly discussed herein. The layers of the LED 34 can be fabricated using known processes with a suitable process being fabrication using metal organic chemical vapor deposition (MOCVD). The layers of the LEDs 34 generally comprise an active layer/region sandwiched between first and second oppositely doped epitaxial layers all of which are formed successively on a growth substrate. LEDs can be formed on a wafer and then singulated for mounting in a package. It is understood that the growth substrate can remain as part of the final singulated LED or the growth substrate can be fully or partially removed.

It is also understood that additional layers and elements can also be included in the LED 34, including but not limited to buffer, nucleation, contact and current spreading layers as well as light extraction layers and elements. The active region can comprise single quantum well (SQW), multiple quantum well (MQW), double heterostructure or super lattice structures. The active region and doped layers may be fabricated from different material systems, with preferred material systems being Group-III nitride based material systems. Group-III nitrides refer to those semiconductor compounds formed between nitrogen and the elements in the Group III of the periodic table, usually aluminum (Al), gallium (Ga), and indium (In). The term also refers to ternary and quaternary compounds such as aluminum gallium nitride (AlGaN) and aluminum indium gallium nitride (AlInGaN). In a preferred embodiment, the doped layers are gallium nitride (GaN) and the active region is InGaN. In alternative embodiments the doped layers may be AlGaN, aluminum gallium arsenide (AlGaAs) or aluminum gallium indium arsenide phosphide (AlGaInAsP).

The growth substrate can be made of many materials such at sapphire, silicon carbide, aluminum nitride (AlN), GaN, with a suitable substrate being a 4H polytype of silicon carbide, although other silicon carbide polytypes can also be used including 3C, 6H and 15R polytypes. Silicon carbide has certain advantages, such as a closer crystal lattice match to Group III nitrides than sapphire and results in Group III nitride films of higher quality. Silicon carbide also has a very high thermal conductivity so that the total output power of Group-III nitride devices on silicon carbide are typically not limited by the thermal dissipation of the substrate (as may be the case with some devices formed on sapphire). SiC substrates are available from Cree Research, Inc., of Durham, N.C. and methods for producing them are set forth in the scientific literature as well as in a U.S. Pat. No. Re. 34,861; U.S. Pat. Nos. 4,946,547; and 5,200,022.

The LED 34 can also comprise a conductive current spreading structure 36 and wire bond pads 38 on its top surface, both of which are made of a conductive material and can be deposited using known methods. Some materials that can be used for these elements include Au, Cu, Ni, In, Al, Ag or combinations thereof and conducting oxides and transparent conducting oxides. The current spreading structure 36 generally comprises conductive fingers 37 arranged in a grid on the LED 34 with the fingers spaced to enhance current spreading from the pads 38 into the LED's top surface. In operation, an electrical signal is applied to the pads 38, such as through a wire bond as described below, and the electrical signal spreads through the fingers 37 of the current spreading structure 36 and the top surface into the LED 34. Current spreading structures are often used in LEDs where the top surface is p-type, but can also be used for n-type materials.

The LED can be coated with one or more phosphors with the phosphors absorbing at least some of the LED light and emitting a different wavelength of light such that the LED emits a combination of light from the LED and the phosphor. In a preferred embodiment the LED emits a white light combination of LED and phosphor light. The LED can be coated and fabricated using many different methods, with one suitable method being described in U.S. patent application Ser. No. 11/656,759 and Ser. No. 11/899,790, now U.S. Pat. Nos. 9,024,39 and 9,159,888, respectively, both entitled "Wafer Level Phosphor Coating Method and Devices Fabricated Utilizing Method", and both of which are incorporated herein by reference. Alternatively the LEDs can be coated using other methods such an electrophoretic deposition (EPD), with a suitable EPD method described in U.S. patent application Ser. No. 11/473,089, now U.S. Pat. No. 8,563,339, entitled "System for and Method For Closed Loop Electrophoretic Deposition of Phosphor Materials on Semiconductor Devices", which is also incorporated herein by reference. It is understood that LED packages according to the present invention can also have multiple LEDs of different colors, one or more of which may be white emitting.

The submount 32 can be formed of many different materials with a preferred material being electrically insulating. Suitable materials include, but are not limited to ceramic materials such as aluminum oxide, aluminum nitride or organic insulators like polyimide(PI) and polyphthalamide (PPA). In other embodiments the submount 32 can comprise a printed circuit board (PCB), sapphire or silicon or any other suitable material, such as T-Clad thermal clad insulated substrate material, available from The Bergquist Company of Chanhassen, Minn. For PCB embodiments different PCB types can be used such as standard FR-4 PCB, metal core PCB, or any other type of printed circuit board. As more fully described below, LED packages according to the present invention can be fabricated using a method that utilizes a submount panel sized to accommodate a plurality of sumbmounts. Multiple LED packages can be formed on the panel, with the individual packages being singulated from the panel.

The submount 32 has a top surface 40 comprising patterned conductive features that can include a die attach pad 42 with an integral first contact pad 44. A second contact pad 46 is also included on the submount's top surface 40 with the LED 34 mounted approximately at the center of the attach pad 42. These patterned conductive features provide conductive paths for electrical connection to the LED 34 using known contacting methods. The LED can be mounted to the attach pad 42 using known methods and material mounting such as using conventional solder materials that may or may not contain a flux material or dispensed polymeric materials that may be thermally and electrically conductive.

The size of the submount 32 in package 30 can vary depending on different factors, with one being the size of the LED. For example, the size of the package 30 can be essentially of the same dimension as the effective heat spreading area in the attach pad, and first and second contact pads 42, 44, and 46. In a package having a 1 mm LED, the submount can be approximately 3.5 mm by 3.5 mm; with a package having a 0.7 mm chip it can be 3.2 mm by 3.2 mm and generally of square shape in both cases. It is further understood that the submount can have other shapes including circular, rectangular or other multiple sided shapes.

The attach pad 42 and first and second contact pads 44, 46 can comprise much different material such as metals or other conductive materials. In one embodiment the pads 42, 44, 46 comprise copper deposited using known techniques such as plating. In typical plating process a titanium adhesion layer and copper seed layer are sequentially sputtered onto a substrate. Then, approximately 75 microns of copper is plated onto the copper seed layer. The resulting copper layer being deposited can then be patterned using standard lithographic processes. In other embodiments the layer can be sputtered using a mask to form the desired pattern.

In some embodiments according to the present invention some of the conductive features can include only copper, with others of the features including additional materials. For example, the attach pad 42 can be plated or coated with additional metals or materials to the make the attach pad 42 more suitable for mounting an LED 34. For example, the attach pad 42 can be plated with adhesive or bonding materials, or reflective and barrier layers.

A gap 48 (best shown in FIGS. 2a and 2d) is included between the second pad 46 and the attach pad 42 down to the surface of the submount 32 that, with the gap providing electrical isolation between the attach pad 42 and second pad 46. As more further described below, an electrical signal is applied to the LED 34 through the second pad 46 and the first pad 44, with the electrical signal on the first pad 44 passing directly to the LED 34 through the attach pad 42 and the signal from the second pad passing into the LED 34 through wire bonds. The gap 48 provides electrical isolation between the second pad and attach pad to prevent shorting of the signal applied to the LED 34.

In some embodiments an electrical signal can be applied to the package 30 by providing external electrical contact to the first and second bond pads 44, 46 such as by solder contacts or other conductive paths to a PCB. In the embodiment shown the LED package 30 is arranged for mounting using surface mount technology and having internal conductive paths. The LED 30 comprises first and second surface mount pads 50, 52 (best shown in FIGS. 2c and 2e) that can be formed on the submount's back surface 54, at least partially in alignment with the first and second contact pads 44, 46, respectfully. Conductive vias 56 are formed through the submount 32 between the first mounting pad 50 and the first contact pad 44, such that when a signal is applied to the first mounting pad 50 is conducted to first contact pad 44. Similarly, conductive vias 56 are formed between the second mounting pad 52 and second contact pad 46 to conduct an electrical signal between the two. The first and second mounting pads 50, 52 allow for surface mounting of the LED package 30 with the electrical signal to be applied to the LED 34 applied across the first and second mounting pads 50, 52. The vias 56 and mounting pads 50,52 can made of many different materials deposited using different techniques, such as those used for the attach and contact pads 42, 44, 46.

It is understood that the mounting pads 50, 52 and vias 56 can be arranged in many different ways and can have many different shapes and sizes. It is also understood that instead of vias, one or more conductive traces can be provided on the surface of the submount between the mounting pads and contact pads, such as along the side surface of the submount.

A solder mask 58 made of conventional materials can be included on the submount's top surface 40, at least partially covering the attach pad 42 and the first and second contact pads 44, 46, and at least partially covering the gap 48. The solder mask 58 protects these features during subsequent processing steps and in particular mounting the LED 34 to the attach pad 42 and wire bonding. During these steps there can be a danger of solder or other materials depositing in undesired areas, which can result in damage to the areas or result in electrical shorting. The solder mask serves as an insulating and protective material that can reduce or prevent these dangers. The solder mask comprises an opening for mounting the LED 34 to the attach pad 42 and for attaching wire bonds to the second contact pad 46. It also comprises side openings 60 to allow convenient electrical access to the contact pads 44, 46 for testing the package 30 during fabrication. The solder mask 58 also has alignment holes that provide for alignment during fabrication of the package 30 and also allow for alignment when mounted in place by the end user.

In some embodiments the solder mask can be provided with a symbol or indicator 69 to illustrate which side of the LED package 30 should be coupled to the plus or minus of the signal to be applied to the package. This can ensure accurate mounting of the LED package 30 to a PCB or other fixture, whether by machine or hand. In the embodiment shown the symbol 69 comprises a plus (+) sign over the first contact pad 44, indicating that the package 30 should be mounted with the positive of the signal coupled to the first mounting pad 50. The minus of the signal would then be coupled to the second mounting pad 52. It is understood that many different symbol types can be used and that a symbol can also be included over the second conductive pad 46. It is also understood that the symbols can be placed in other locations other than the solder mask 58.

The package 30 can also comprise elements to protect against damage from electrostatic discharge (ESD). In the embodiment shown the elements are on-chip, and different elements can be used such as various vertical silicon (Si) Zener diodes, different LEDs arranged in parallel and reverse biased to the LED 34, surface mount varistors and lateral Si diodes. In the embodiment shown a Zener diode 62 is utilized and is mounted to the attach pad 42 using known mounting techniques. The diode is relatively small so that it does not cover an excessive area on the surface of the submount 32.

It is noted that the solder mask 58 includes and opening for the ESD diode 62 so that it can be mounted to the attach pad 42. Different mounting materials and methods can be used such as those used to mount the LED 34 to the attach pad 42. An ESD wire bond 64 is included between the second contact pad 46 at the solder mask opening and the ESD diode 62. Two LED wire bonds 65 are also included between the solder mask opening in the second contact pad 46 and wire bond pads 38 on the LED 34. In other embodiments only one wire bond can be included between the LED 34 and second contact pad. This LED 34 and ESD diode 62 arrangement allows excessive voltage and/or current passing through the LED package 30 from an ESD event to pass through the diode 62 instead of the LED 34, protecting the LED 34 from damage. The wire bonds 64 and 65 can be applied using known methods and can comprise known conductive materials, with a suitable material being gold (Au). It is understood that in other embodiments of an LED package according to the present invention can be provided without an ESD element/diode or with an ESD element/diode that is external to the LED package 30.

As mentioned above, heat typically does not spread efficiently into the submount 32, particularly those made of materials such as ceramic. When an LED is provided on an attach pad that extends generally only under the LED, heat does not spread through most of the submount, and is generally concentrated to the area just below the LED. This can cause overheating of the LED which can limit the operating power level for the LED package.

To improve heat dissipation in the LED package 30 the pads 42, 44, 46 provide extending thermally conductive paths to laterally conduct heat away from the LED 34 such that it can spread to other areas of the submount beyond the areas just below the LED 34. The attach pad 42 covers more of the surface of the submount 32 than the LED 34, with the attach pad extending from the edges of the LED 34 toward the edges of the submount 32. In the embodiment shown, the attach pad 42 is generally circular and extending radially from LED 34 toward the edges of the submount 32. A portion of the attach pad 42 intersects with the first and second contact pads 44, 46, with the gap 48 separating part of the attach pad adjacent to the second contact pad 46. It is understood that the contact pad 42 can be many other shapes and in some embodiments it can extend to the edge of the submount 32.

The contact pads 44, 46 also cover the surface of the submount 32 extending out from the vias, and covering the area between the vias 56, and the area between the vias 56 and the edges of the submount 32. By extending the pads 42, 44 and 46 this way, the heat spreading from the LED 34 is improved. This improves thermal dissipation of heat generated in the LED 34, which improves its operating life and allows for higher operating power. The pads 42, 44, and 46 can cover different percentages of the top surface 40 of the submount 32, with a typical coverage area being greater than 50%. In the LED package 30, the pads 42, 44 and 46 can cover approximately 70% of the submount. In other embodiments the coverage area can be greater than 75%.

The LED package 30 can further comprise a metalized area 66 on the back surface 54 of the submount, between the first and second mounting pads 50, 52. The metalized area is preferably made of a heat conductive material and is preferably in at least partial vertical alignment with the LED 34. In one embodiment, the metalized area is not in electrical contact with the elements on top surface of the submount 32 or the first and second mounting pads on the back surface of the submount 32. Although heat from the LED is laterally spread over the top surface of the submount by the attach pad 42 and the pads 44, 46 more heat will pass into the submount 32 directly below and around the LED 34. The metalized area can assist with this dissipation by allowing this heat to spread into the metalized area where it can dissipate more readily. It is also noted that the heat can conduct from the top surface of the submount 32, through the vias 56, where the heat can spread into the first and second mounting pads 50, 52 where it can also dissipate. For the package 30 used in surface mounting, the thickness of the metalized area 66 (best shown in FIGS. 2c and 2e) and the first and second pads 50, 52 should be approximately the same such that all three make contact to a lateral surface such as a PCB.

Three solder dams 67 can be included around the area of the attach pad 42 for mounting of the LED 34, with the solder dams serving to help center the LED and to reduce movement of the LED from the mounting area during while the mounting solder is in liquid form. When the liquid solder encounters any one of the dams, movement is slowed or stopped. This helps reduce the movement of the LED until the solder hardens.

An optical element or lens 70 is formed on the top surface 40 of the submount 32, over the LED 34, to provide both environmental and/or mechanical protection. The lens 70 can be in different locations on the top surface 40 with the lens located as shown with the LED 34 at approximately the center of the lens base. In some embodiments the lens can be formed in direct contact with the LED 34 and the submount's top surface 40. In other embodiments there may be an intervening material or layer between the LED 34 and/or top surface 40. Direct contact to the LED 34 provides certain advantages such as improved light extraction and ease of fabricating.

As further described below, the lens 70 can be molded using different molding techniques and the lens can be many different shapes depending on the desired shape of the light output. One suitable shape as shown is hemispheric, with some examples of alternative shapes being ellipsoid bullet, flat, hex-shaped and square. Many different materials can be used for the lens such as silicones, plastics, epoxies or glass, with a suitable material being compatible with molding processes. Silicone is suitable for molding and provides suitable optical transmission properties. It can also withstand subsequent reflow processes and does not significantly degrade over time. It is understood that the lens 70 can also be textured to improve light extraction or can contain materials such as phosphors or scattering particles.

The LED package 30 can also comprise a protective layer 74 covering the submount's top surface 40 between the lens 70 and edge of the submount 32. The layer 74 provides additional protection to the elements on the top surface to reduce damage and contamination during subsequent processing steps and use. Protective layer 74 can be formed during formation of the lens 70 and can comprise the same material as the lens 70. It is understood, however, that the LED package 30 can also be provided without the protective layer 74.

The lens 70 should also be able to withstand certain sheer forces before being displaced from the submount 32. In one embodiment, the lens can withstand a 1 kilogram (kg) or more sheer force. In embodiments of the LED package using silicones that are harder after curing and have a higher durometer reading, such as Shore A 70 or higher, tend to better withstand sheer forces. Properties such as high adhesion and high tensile strength may also contribute to the ability of the lens to withstand sheer forces.

The lens arrangement of the LED package 30 is also easily adapted for use with secondary lens or optics that can be includes over the lens by the end user to facilitate beam shaping. These secondary lenses are generally known in the art, with many of them being commercially available.

FIGS. 3a to 3e show another embodiment of an LED package 100 according to the present invention having similar features to those in LED package 30. For similar features the same reference numbers are used herein and in FIGS. 4a and 4b below with the understanding that the description above applies equally to this embodiment. The LED package 100 comprises a submount 32, and LED 34, a lens 70 and wire bonds 64 and 65. Like the LED package 30, LED package 100 is arranged for surface mounting but has a different arrangement for its conductive pads that provides for contacting at one side of the submount 32.

The LED package comprises an attach pad 102 with an integral first contact pad 104, separated by a gap 108 from a second contact pad 106. A gap 108 provides electrical isolation as described above. The LED 34 is mounted to the attach pad using the methods described above, and the wire bond 65 runs between the second contact pad 106 to conduct the electrical signal at the second contact pad 106 to the LED 34. The first and second contact pads 104, 106 are not on opposite sides of the submount 32, but are instead on the same side. The attach pad 102 covers most of the submount's top surface 40 to provide improved heat spreading as described above. The first and second contact pads 104, 106 also cover portions of the top surface to assist in current spreading.

First and second surface mount contact 110, 112 are included on the submount's back surface 54, at least in partial vertical alignment with the first and second contact pads 104, 106, respectively. Conductive vias 114 run through the submount between the first surface mount contact 110 and the first contact pad 104, and the second surface mount contact 112 and the second contact pad 106, so that an electrical signal on the surface mount contacts 110, 112 is conducted through the vias to the contact pads 104, 106. The signal is then conducted to the LED 34. The LED package 100 also comprises a metalized area 116 to further improve heat spreading from the LED 34 and submount 32. The metalized area 116, however, is not between the surface mount contacts 110, 112 but covers an area of the back surface 54 opposite them.

The LED package 100 as shown does not have a protective layer covering the submount's top surface 40 between the edge of the lens 70 and the edge of the top surface 40, although such a protective layer can be included in other embodiments. The LED package 100 can also be provided with an ESD protection element 62 and solder mask 58 as described above. The LED package 100 provides for improved thermal management as in LED package 30, but allows for surface mount contacting along one side of the submount instead of opposite sides. The LED package can also include symbols 118 to assist in alignment by the end user.

Figure 4A:
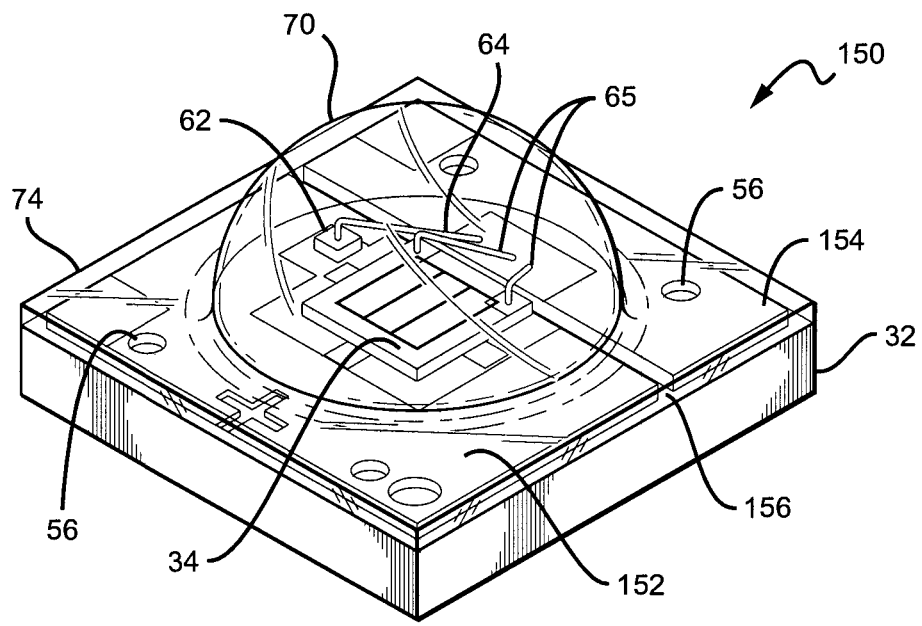
FIG. 4a is an upper perspective view of another embodiment of an LED package according to the present invention.
Figure 4B:
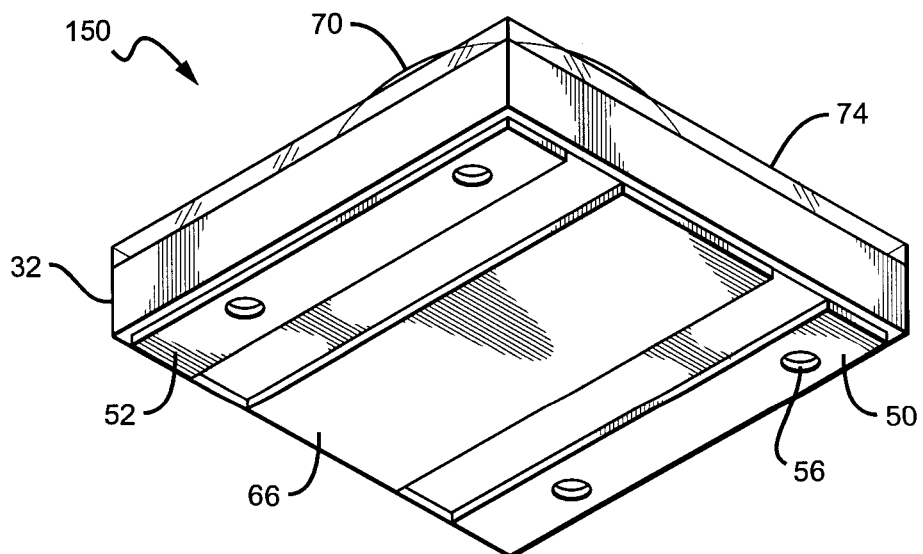

FIGS. 4a and 4b show still another embodiment of an LED package 150 according to the present invention generally comprising a submount 32, LED 34, first and second contact pads 50, 52, vias 56, ESD diode 62, wire bonds 64, 65, metalized area 66, lens 70 and protective layer 74. In this embodiment, however, the attach pad is not circular, but in combination with the first contact pad, comprises a rectangular shaped first conductive layer 152 on and covering the majority the submount 32. Vias 56 run between the first layer 152 and the first contact pad 50 on one side of the first layer 152, with the LED and ESD diode mounted to a attach pad area on the opposing side.

A second conductive layer 154 covers most of the remainder of the submount's top surface, with a gap 156 between the first and second layers 152, 154. Vias 56 run between the second layer 154 and the second contact pad 52, with the wire bonds 64, 65 running between the second layer 154 and the LED 43 and ESD diode 62. Like the embodiments above, an electrical signal applied to the first and second contact pads 50, 52 is conducted to the LED 34, causing it to emit light.

In this embodiment, the first and second layers 152, 154 cover substantially all of the submount's top surface, providing the capability for broad lateral heat spreading from the LED 34. This arrangement, however, presents a minimal pattern for pattern recognition during assembly. By comparison, the shaped pad arrangement shown in FIGS. 2a-2g provides for greater pattern recognition for assembly, while at the same time providing suitable lateral current spreading.

Figure 5:
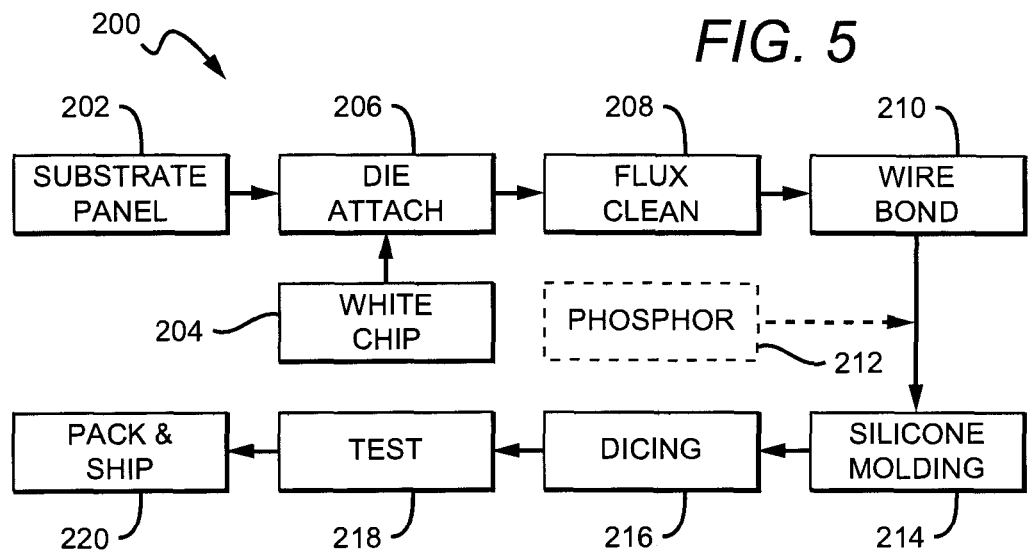
FIG. 5 is a flow diagram for one embodiment of a fabrication method according to the present invention.

The present invention also provides for improved methods for fabricating LED packages wherein multiple packages can be fabricated simultaneously. This reduces cost and complexity in fabrication, and allows for fabrication of devices with controlled features and emission characteristics. FIG. 5 shows one embodiment of an LED package fabrication method 200 according to the present invention. In 202 a substrate (submount) panel that can be diced in subsequent manufacturing steps to provide a plurality of individual submounts. A panel is provided to allow for the simultaneous fabrication of a plurality of packages. It is understood that a separate processing step is required for providing the LED package conductive features on the panel. These features can include the attach pad, contact pads, surface mount pads, vias and metalized area, all of which can be arranged to assist in dissipating heat generated by the LED. The panel will comprise a plurality of these features arranged in sets, each of the sets corresponding to one of the plurality of packages to be formed from the panel. Many different panel sizes can be used such as for example, 3 inches by 4 inches, 2 inches by 4 inches, and 4 inches by 4 inches.

In 204 a plurality of LEDs are provided, each of which is to be mounted to a respective one of the attach pads on the substrate panel. In one embodiment, the plurality of LEDs comprise white emitting LEDs chips, and many different white chips can be used with a suitable white chip being described in the patent applications mentioned above and incorporated herein. In other embodiments more than one LED can be provided for mounting to each of the attach pads. In this step a plurality of ESD protection elements can also be provided, each of which can be mounted in conjunction with one of the attach pads to provide ESD protection for its LED package.

In 206 each of the LEDs is die attached to the one of the attach pads, and as mentioned above, many different mounting methods and materials can be used, with a suitable method being mounting using conventional solder materials and methods. In this step each of the ESD elements can also be mounted to a respective attach pad using the same mounting method and material. It is understood that the ESD element can also be mounted in other locations using other methods.

In 208 the panel undergoes a solder flux clean to remove any flux that may have accumulated during previous processing steps. In 210 wire bonds are formed on the for each of the LEDs and ESD elements electrically connecting them to the appropriate one of their respective contact pads. As described above, each of the LEDs and their accompanying ESD element can be wire bonded to the second contact pad. The wire bonds can be formed using known processes and can be made of known conductive materials such as gold.

In some embodiments the LEDs can be provided and mounted to the panel without the desired conversion material. In these embodiments the conversion material can be deposited on the LED after wire bonding. In optional 212 the conversion material or phosphor is deposited on the LED and many different known phosphor deposition methods can be used such as electrophoretic deposition or EPD. Many different phosphor deposition processes can be used with a suitable EPD process described in the patent application described above.

Figure 6A:
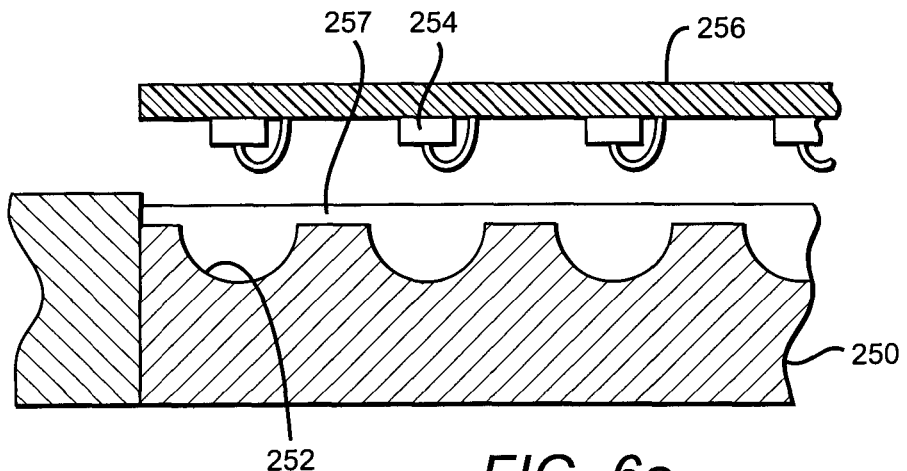
FIG. 6a is a sectional view of one embodiment of a lens mold according to the present invention.
Figure 6B:
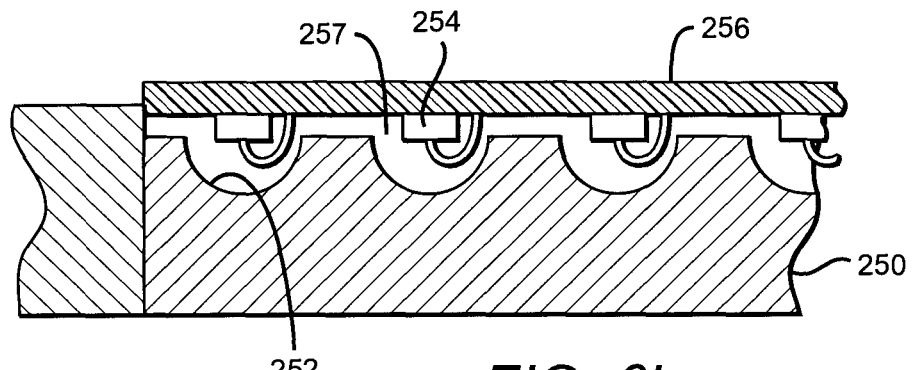

In 214 a lens is molded over each of the LEDs and many different molding methods can be used. In one embodiment a molding process is used that simultaneously forms lenses over the LEDs in the submount panel. One such molding process is referred to as compression molding processes. Referring now to FIGS. 6a and 6b one embodiment of compression molding is shown wherein a mold 250 is provided having a plurality of cavities 252 each of which has an inverted shape of the lens, wherein each cavity 252 is arranged to align with a respective one of the LEDs 254 on a substrate panel 256. The mold 250 is loaded with a lens material 257 in liquid form filling the cavities 252, with the preferred material being liquid curable silicone. Referring to 5b, the panel 256 is moved toward the cavity with each of the LEDs 254 being embedded in the liquid silicone within one a respective one of the cavities 252. In one embodiment a layer of silicone can also remain between adjacent lenses that provides a protective layer over the top surface of the submount. The liquid silicone can then be cured using known curing processes. The panel can then be removed from the mold and as shown in FIGS. 7a and 7b the panel can comprise a plurality of lenses 258, each of which is over a respective one of the LEDs 254. The individual LED packages can then be separated from the panel, such as along dashed lines shown.

Referring again to FIG. 5, in 216 the panel can then diced/singulated to separate the individual LED packages and different methods can be used such as known saw singulation methods. When using this method a tape can be attached to the panel prior to singulation to hold and stabilize the panel and individual LED packages. Following singulation, the LED packages can be cleaned and dried.

In 218 each of the LED packages can be tested to be sure they are operating correctly and to measure each device output light characteristics. It is understood that the packages can also be tested at different points in this method by probing the submount panel. In 220 the LED packages can be binned according to their output characteristics, packaged according to each bin, and shipped to the customer.

One embodiment of a method is described herein, but it is understood that different embodiments of methods according to the present invention can use the same steps in different order or can have different steps. Regarding the LED packages, the present invention has been described in detail with reference to certain preferred configurations thereof, other versions are possible. Therefore, the spirit and scope of the invention should not be limited to the versions described above.

We claim:

1. A light emitting diode (LED) package, comprising:
a submount comprising a first side and a second side that is opposite the first side;
a first contact pad and a second contact pad on the first side of the submount;
an LED mounted on at least one of the first contact pad and the second contact pad; and
a solder mask on the first contact pad and the second contact pad, wherein a portion of the solder mask forms at least one symbol that indicates a mounting orientation of the LED package, and the mounting orientation comprises an orientation for at least one of positive and negative electrical connections for the LED package.

2. The LED package of claim 1, wherein the at least one symbol comprises at least one of a plus sign and a minus sign.

3. The LED package of claim 1, wherein the at least one symbol comprises both a plus sign and a minus sign.

4. The LED package of claim 1, wherein a gap is formed between the first contact pad and the second contact pad on the first side of the submount, and a portion of the solder mask is arranged in the gap.

5. The LED package of claim 1, wherein the solder mask forms a first opening and the LED is mounted within the first opening.

6. The LED package of claim 5, wherein the solder mask forms a second opening over at least one of the first contact pad and the second contact pad.

7. The LED package of claim 1, wherein at least one of the first contact pad and the second contact pad forms at least one solder dam that is adjacent to the LED.

8. The LED package of claim 1, further comprising a lens that is molded over the LED and the submount.

9. The LED package of claim 8, wherein the lens comprises silicone with a Shore durometer of at least A70.

10. The LED package of claim 8, further comprising a protective layer that extends from the lens to a side edge of the submount.

11. The LED package of claim 10, wherein:
the solder mask forms a first opening where the LED is mounted;
the solder mask forms a second opening over at least one of the first contact pad and the second contact pad; and
a portion of the protective layer extends over the second opening.

12. The LED package of claim 1, wherein at least one of the first contact pad and the second contact pad comprises a die attach pad with a curved shape that radially extends toward one or more edges of the submount.

13. The LED package of claim 12, further comprising a lens with a hemispheric shape, wherein the lens is positioned over the die attach pad.

14. A light emitting diode (LED) package, comprising:
a submount comprising a first side, a second side that is opposite the first side, and a plurality of submount edges that are between the first side and the second side;
a first contact pad and a second contact pad on the first side of the submount, wherein a gap is formed between the first contact pad and the second contact pad;
an LED mounted on at least one of the first contact pad and the second contact pad;
a lens on the first side of the submount and over the LED; and
a protective layer that is integral with the lens, wherein the protective layer extends from the lens to the plurality of submount edges, wherein a portion of the protective layer that is between a lateral boundary of the lens and at least one submount edge of the plurality of submount edges is within the gap.

15. The LED package of claim 14, wherein the first contact pad and the second contact pad cover at least 70% of the first side of the submount.

16. The LED package of claim 14, wherein the first contact pad and the second contact pad cover at least 75% of the first side of the submount.

17. The LED package of claim 14, wherein the protective layer is arranged on at least a portion of the first contact pad and the second contact pad.

18. The LED package of claim 14, wherein a dimension of the first side of the submount is less than or equal to 3.5 mm.

19. The LED package of claim 14, wherein the submount comprises one or more of aluminum oxide, aluminum nitride, polyimide, and polyphthalamide.

20. The LED package of claim 14, wherein the lens comprises a molded lens over the LED and the submount.

21. The LED package of claim 20, wherein the lens comprises silicone with a Shore durometer of at least A70.

22. The LED package of claim 14, wherein the lens and the protective layer comprise silicone.

* * * * *